US012733278B2

(12) United States Patent
Ishino

(10) Patent No.: US 12,733,278 B2
(45) Date of Patent: Sep. 8, 2026

(54) PHOTOELECTRIC CONVERSION DEVICE, MANUFACTURING METHOD OF PHOTOELECTRIC CONVERSION DEVICE, IMAGING SYSTEM, MOVING UNIT, AND EQUIPMENT

(71) Applicant: CANON KABUSHIKI KAISHA, Tokyo (JP)

(72) Inventor: Hideaki Ishino, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 452 days.

(21) Appl. No.: 18/318,488

(22) Filed: May 16, 2023

(65) Prior Publication Data

US 2023/0387157 A1 Nov. 30, 2023

(30) Foreign Application Priority Data

May 27, 2022 (JP) ................................ 2022-086895

(51) Int. Cl.
*H10F 39/18* (2025.01)
*H10F 39/00* (2025.01)

(52) U.S. Cl.
CPC ....... *H10F 39/8057* (2025.01); *H10F 39/024* (2025.01); *H10F 39/182* (2025.01)

(58) Field of Classification Search
CPC .......................... H10F 39/182; H10F 39/8057
See application file for complete search history.

(56) References Cited

U.S. PATENT DOCUMENTS

2020/0251518 A1* 8/2020 Ogino ..................... H01L 24/05
2022/0123032 A1* 4/2022 Lee ..................... H10F 39/8063
2025/0063839 A1* 2/2025 Kitamura ............. H10F 39/805

FOREIGN PATENT DOCUMENTS

JP 2010245506 A 10/2010
JP 2013026565 A 2/2013
JP 2013080838 A 5/2013
JP 2019212737 A 12/2019
JP 2022034522 A 3/2022

* cited by examiner

*Primary Examiner* — Nelson Garces
(74) *Attorney, Agent, or Firm* — Canon U.S.A., Inc., IP Division

(57) ABSTRACT

A photoelectric conversion device includes a semiconductor substrate, an insulating layer, a light-receiving pixel region, first and second light-shielded regions, and a peripheral region. The insulating layer allows light to pass through the insulating layer. The first light-shielded region includes a light-shielding film formed on the insulating layer. The peripheral region has an opening that penetrates the insulating layer and the semiconductor substrate and exposes a bonding pad of the semiconductor substrate. A first trench is formed in the semiconductor substrate in the second light-shielded region. A second trench is formed in the insulating layer in the second light-shielded region and penetrates the insulating layer. A side face and a bottom face of the second trench are covered with the light-shielding film formed on the insulating layer. In a planar view to the semiconductor substrate, the first trench and the second trench have portions overlapping each other.

25 Claims, 24 Drawing Sheets

FIG. 9B 300
312
EXTERNAL I/F UNIT
COMPUTER
316
STORAGE MEDIUM CONTROL I/F UNIT
314
STORAGE MEDIUM
310
MEMORY UNIT
308
SIGNAL PROCESSING UNIT
318
GENERAL CONTROL/OPERATION UNIT
320
TIMING GENERATION UNIT
301
IMAGING DEVICE
304
APERTURE
302
306

PHOTOELECTRIC CONVERSION DEVICE, MANUFACTURING METHOD OF PHOTOELECTRIC CONVERSION DEVICE, IMAGING SYSTEM, MOVING UNIT, AND EQUIPMENT

BACKGROUND

Field

The present disclosure relates to a photoelectric conversion device, a manufacturing method of a photoelectric conversion device, an imaging system, a moving unit, and equipment.

Description of the Related Art

Japanese Patent Application Laid-Open No. 2019-212737 discloses a back-side illuminated photoelectric conversion device that shields an optical black (OB) pixel region and a peripheral region from light by a light-shielding film. In this photoelectric conversion device, an insulating layer made of an insulating film including a fixed charge film is formed between a semiconductor substrate in which photoelectric conversion units are formed and the light-shielding film. The back-side illuminated photoelectric conversion device disclosed in Japanese Patent Application Laid-Open No. 2019-212737 may include a bonding pad and a pad opening to expose the bonding pad from the light incidence plane side in a chip outer circumferential part. This photoelectric conversion device may be insufficient suppression of stray light resulted from incident light from the pad opening propagating inside the semiconductor substrate and the insulating layer located between the semiconductor substrate and the light-shielding film and then entering the OB pixel region. Occurrence of charges due to such stray light will deteriorate dark-state characteristics of the photoelectric conversion device, for example.

SUMMARY

The disclosed photoelectric conversion device works towards suppressing stray light that may enter a photoelectric conversion device via a pad opening.

According to an aspect of the present disclosure, a photoelectric conversion device includes a semiconductor substrate having a first face in which a plurality of photoelectric conversion units are formed and a second face opposed to the first face, an insulating layer provided on the second face and configured to receive entry of light in the insulating layer, a light-receiving pixel region in which the plurality of photoelectric conversion units are arranged and light transmitting through the insulating layer is received at the plurality of photoelectric conversion units, a first light-shielded region located adjacent to the light-receiving pixel region and having a light-shielding film formed on the insulating layer, a peripheral region including an opening that penetrates the insulating layer and the semiconductor substrate and exposes a bonding pad provided on the first face side, and a second light-shielded region located between the first light-shielded region and the peripheral region and having the light-shielding film formed on the insulating layer, wherein a first trench is formed in the semiconductor substrate in the second light-shielded region, wherein a second trench is formed in the insulating layer in the second light-shielded region, wherein the second trench penetrates the insulating layer, wherein a side face and a bottom face of the second trench are covered with the light-shielding film, and wherein, in a planar view to the semiconductor substrate, the first trench and the second trench have portions overlapping each other.

Further features of the present disclosure will become apparent from the following description of exemplary embodiments with reference to the attached drawings.

BRIEF DESCRIPTION OF THE DRAWINGS

FIG. 4A is a schematic sectional view of the photoelectric conversion device according to the first embodiment.

FIG. 5C is a schematic sectional view illustrating the manufacturing method of the photoelectric conversion device according to the first embodiment.

FIG. 5H is a schematic sectional view illustrating the manufacturing method of the photoelectric conversion device according to the first embodiment.

FIG. 5I is a schematic sectional view illustrating the manufacturing method of the photoelectric conversion device according to the first embodiment.

FIG. 7 is a schematic sectional view of a photoelectric conversion device according to a third embodiment.

FIG. 8A is a schematic sectional view of a photoelectric conversion device according to a fourth embodiment.

FIG. 8B is a plan view of the photoelectric conversion device according to the fourth embodiment.

FIG. 9A is a schematic sectional view of a photoelectric conversion device according to a fifth embodiment.

FIG. 9B is a plan view of the photoelectric conversion device according to the fifth embodiment.

FIG. 12A is a diagram illustrating a configuration example of an imaging system and moving unit according to an eighth embodiment.

FIG. 12B is a diagram illustrating a configuration example of an imaging system and moving unit according to the eighth embodiment.

DESCRIPTION OF THE EMBODIMENTS

A photoelectric conversion device according to embodiments of the present disclosure will be specifically described with reference to the drawings. Throughout the drawings, elements having a common function are labeled with the same reference, and duplicated description thereof may be omitted or simplified.

First Embodiment

Figure 1:
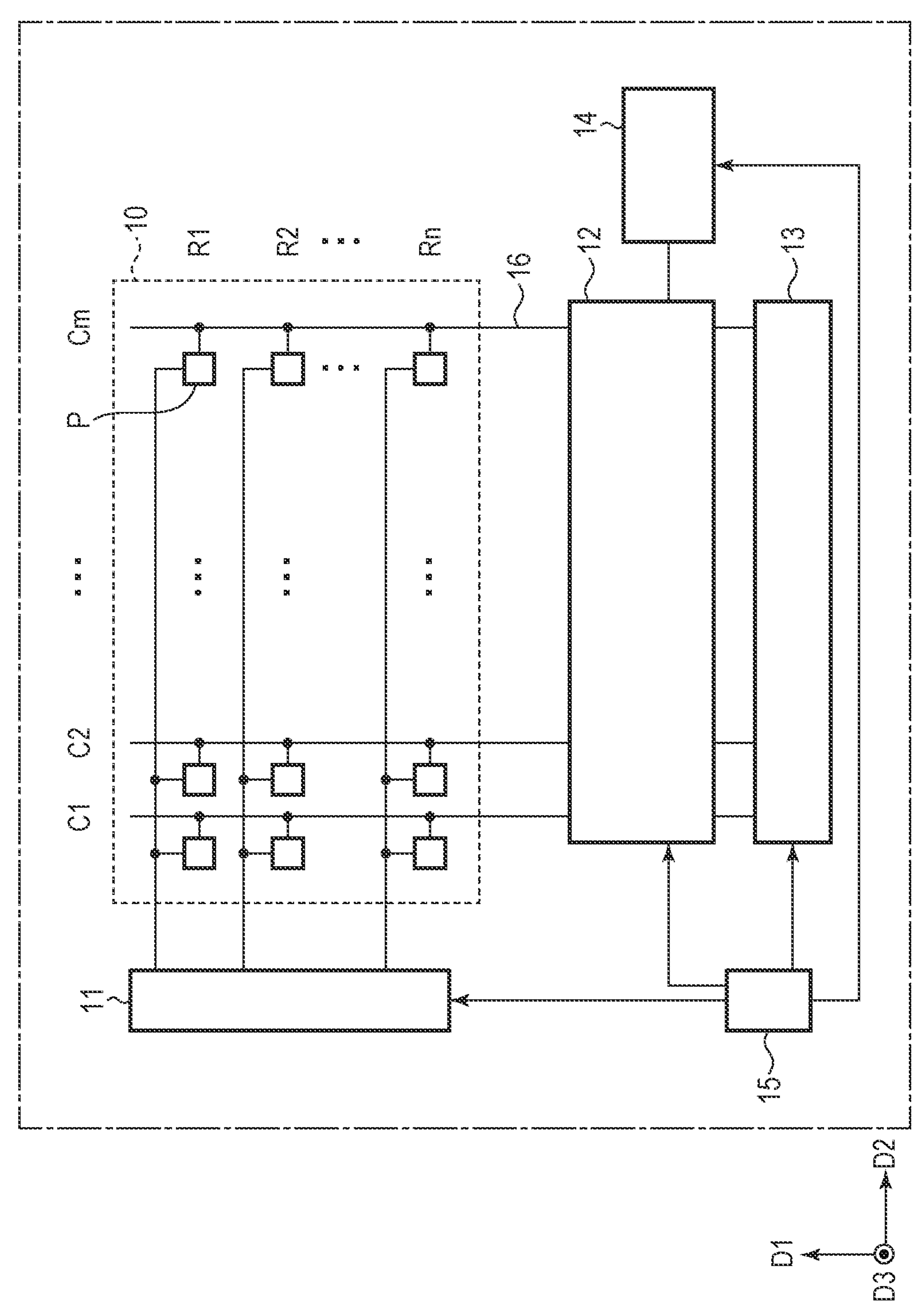
FIG. 1 is a block diagram of a photoelectric conversion device according to a first embodiment.

FIG. 1 is a block diagram of a photoelectric conversion device according to the present embodiment. The photoelectric conversion device is, for example, a CMOS image sensor and includes a pixel array 10, a vertical scanning circuit 11, a column circuit 12, a horizontal scanning circuit 13, an output circuit 14, and a timing generation circuit 15. When the photoelectric conversion device is formed of laminated substrates, the pixel array 10 may be formed in a first substrate, and the vertical scanning circuit 11, the column circuit 12, the horizontal scanning circuit 13, the output circuit 14, and the timing generation circuit 15 may be formed in a second substrate, for example.

The pixel array 10 includes a plurality of pixels P arranged in a matrix. Each of the plurality of pixels P has a photoelectric conversion unit that generates and accumulates signal charges based on incident light. Note that, in the present specification, the row direction (D2 direction) refers to the horizontal direction in FIG. 1, and the column direction (D1 direction) refers to a direction orthogonally intersecting the row direction in FIG. 1. Further, the thickness direction (D3 direction) refers to a direction orthogonally intersecting both the column direction and the row direction. FIG. 1 illustrates the pixels P of n rows by m columns for rows R1 to Rn by columns C1 to Cm. Microlenses and color filters may be arranged over the pixels P. The color filters are primary color filters of red, blue, and green, for example, and are provided to each pixel P in accordance with the Bayer arrangement.

The pixel array 10 includes a light-receiving pixel region and a light-shielded region. No light-shielding film is formed to the pixels P included in the light-receiving pixel region, and pixel signals in accordance with incident light can be output. The light-shielded region is an optical black (OB) pixel region arranged around the light-receiving pixel region. Note that details of the photoelectric conversion unit, the light-receiving pixel region, and the light-shielded region will be described later.

Further, in the pixel array 10, a ranging row on which focus detection pixels that output pixel signals used for focus detection are arranged and a plurality of imaging rows on which imaging pixels that output pixel signals used for generating an image are arranged may be provided. Column signal lines 16 are connected to a plurality of pixels P on each column, and a plurality of pixels P on the same column sequentially output pixel signals on a common column signal line 16.

The vertical scanning circuit 11 is formed of a shift register, a gate circuit, a buffer circuit, or the like and outputs control signals to the pixels P via the column signal lines 16 based on a vertical synchronization signal, a horizontal synchronization signal, a clock signal, or the like to drive the pixels P on a row basis.

The column circuit 12 is connected to each column signal line 16, amplifies pixel signals from the column signal lines 16, and performs analog to digital (AD) conversion. An AD conversion unit of the column circuit 12 may be formed of a comparator that compares a pixel signal with a reference signal, a memory that holds a comparison result and a count signal, and the like.

The horizontal scanning circuit 13 includes a decoder and a shift register, sequentially reads a count value held in the memory of the column circuit 12 as a digital signal, and outputs the read digital signal to a signal processing unit provided inside or outside a chip (imaging device). The signal processing unit includes a digital signal processor and performs digital signal processing such as digital gain, digital correlated double sampling, digital offset, linearity correction, or the like.

The output circuit 14 includes a serial output circuit of a low voltage differential signaling (LVDS) system and outputs a signal-processed digital signal to outside of the solid state imaging device at a high rate and with low power consumption.

The timing generation circuit 15 generates various control signals and drive signals based on a clock and a synchronization signal to control the vertical scanning circuit 11, the column circuit 12, the horizontal scanning circuit 13, and the output circuit 14. Further, the timing generation circuit 15 may include a reference signal output circuit that generates a reference signal (ramp signal) whose voltage changes with time and a counter circuit that generates a count signal synchronized with the reference signal. The counter circuit starts counting at the same time as a change in the potential of the reference signal and supplies the count signal to the column circuit 12. The column circuit 12 holds a count signal in a memory at a timing of inversion of a level relationship between a pixel signal and the reference signal and can output the count signal as an AD-converted digital signal.

In the photoelectric conversion device configured as described above, a dark signal obtained from the light-shielded region is used as data used for correction of pixel signals obtained from the light-receiving pixel region on the same row. For example, a signal resulted by subtracting a dark signal from a pixel signal is output as a corrected signal. A correction process using a dark signal may be performed in a signal processing unit inside the photoelectric conversion device or may be performed in a circuit outside the photoelectric conversion device.

Figure 2:
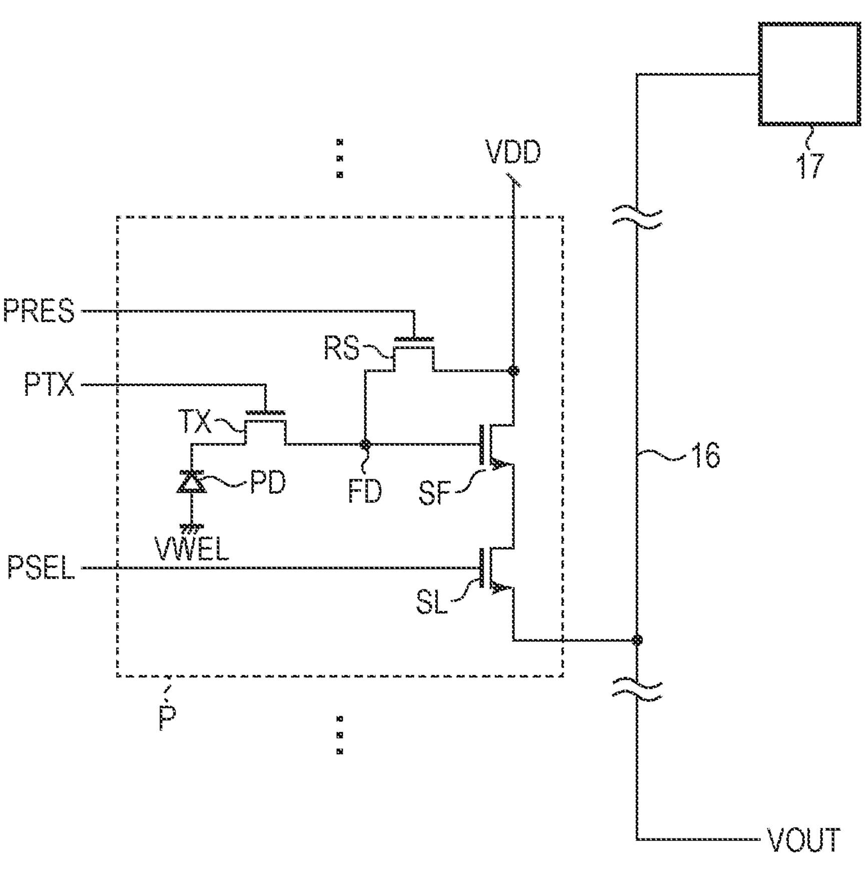
FIG. 2 is an equivalent circuit diagram of a pixel according to the first embodiment.

FIG. 2 is an equivalent circuit diagram of the pixel P according to the present embodiment. The pixel P may include a photoelectric conversion unit PD, a transfer transistor TX, a floating diffusion FD, a reset transistor RS, a source follower transistor SF, and a selection transistor SL. In the following description, each transistor is formed of an N-type metal oxide semiconductor (MOS) transistor unless otherwise specified. A back gate terminal (not illustrated) is supplied with a reference voltage (ground voltage) VWEL (for example, 0 [V]). Further, the reset transistor RS and the source follower transistor SF are connected to a reference voltage (power source voltage) VDD (for example, 3 [V]). The reference voltages VDD and VWEL may be supplied from voltage supply lines (not illustrated). Note that a P-type MOS transistor may be used instead of an N-type MOS transistor. In such a case, the potential of control signals such as a control signal applied to a P-type MOS transistor is inversed from the potential of control signals for an N-type MOS transistor.

The photoelectric conversion unit PD is a photodiode, for example, and performs photoelectric conversion from incident light and accumulation of charges. Note that, instead of a photodiode, a configuration that causes photoelectric effect, such as a photoelectric conversion film of an organic material, a photogate, or the like may be used. The number of photoelectric conversion units PD included in a single pixel P is also not limited, and two or four or more photoelectric conversion units PD may be provided so as to share a single micro-lens. Furthermore, a configuration having an embedded type photodiode can reduce dark current noise. A micro-lens is provided to the photoelectric conversion unit PD, and light collected by the micro-lens enters the photoelectric conversion unit PD.

The transfer transistor TX is provided in association with the photoelectric conversion unit PD, and a control signal PTX is applied to the gate terminal of the transfer transistor TX. When the control signal PTX is activated, charges generated and accumulated due to light received by the photoelectric conversion unit PD are transferred to the floating diffusion FD via the transfer transistor TX.

The reference voltage VDD is applied to the drain terminal of the source follower transistor SF. The source potential of the source follower transistor SF varies in accordance with a change in the charge amount transferred to the floating diffusion FD.

The selection transistor SL is provided between the source follower transistor SF and the column signal line 16. The selection transistors SL of the pixels P on a plurality of rows are connected to a common column signal line 16, and a common constant current sources 17 and each source follower transistor SF form a source follower. A control signal PSEL is applied to the gate terminal of the selection transistor SL. When the control signal PSEL is activated, the selection transistor SL may output an output VOUT in accordance with the source potential of the source follower transistor SF to the column signal line 16.

The source of the reset transistor RS is connected to the floating diffusion FD, and the reference voltage VDD is applied to the drain terminal of the reset transistor RS. A control signal PRES is applied to the gate terminal of the reset transistor RS. When the control signal PRES is activated, the reset transistor RS may reset the potential of the floating diffusion FD.

The constant current source 17 is electrically connected to the column signal line 16, and the constant current source 17 supplies constant bias current to the source terminal of the source follower transistor SF via the column signal line 16.

Figure 3:
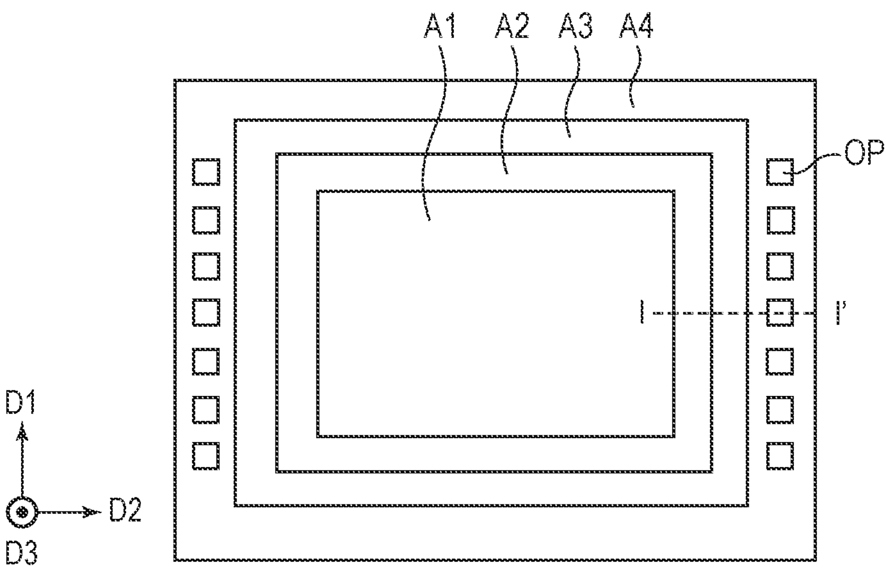
FIG. 3 is a plan view illustrating the structure of the photoelectric conversion device according to the first embodiment.

FIG. 3 is a plan view illustrating the structure of the photoelectric conversion device according to the present embodiment. FIG. 3 illustrates the photoelectric conversion device for one chip. The photoelectric conversion device includes light-receiving pixel region A1, a first light-shielded region A2, a second light-shielded region A3, and a peripheral region A4.

In the light-receiving pixel region A1, a plurality of pixels P are arranged, and the light-receiving pixel region A1 can receive incident light at the photoelectric conversion units PD. The first light-shielded region A2 is adjacent to the light-receiving pixel region A1 and is arranged around the light-receiving pixel region A1. The first light-shielded region A2 is shielded from light by a light-shielding film described later. In the first light-shielded region A2, pixels P shielded from light and a peripheral circuit may be arranged.

The second light-shielded region A3 is adjacent to the first light-shielded region A2 and is arranged around the first light-shielded region A2. That is, the second light-shielded region A3 is located between the first light-shielded region A2 and the peripheral region A4. The second light-shielded region A3 is shielded from light by a light-shielding film in the same manner as the first light-shielded region A2. The peripheral region A4 is adjacent to the second light-shielded region A3 and is arranged around the second light-shielded region A3. The peripheral region A4 is located between the outer edge of the chip and the second light-shielded region A3. In the peripheral region A4, a plurality of pad openings OP are formed, and each of the plurality of pad openings OP exposes a bonding pad provided inside the photoelectric conversion device. Note that, although arranged along only two opposed edges of the chip in FIG. 3, the pad openings OP may be arranged along four edges.

Figure 4A:
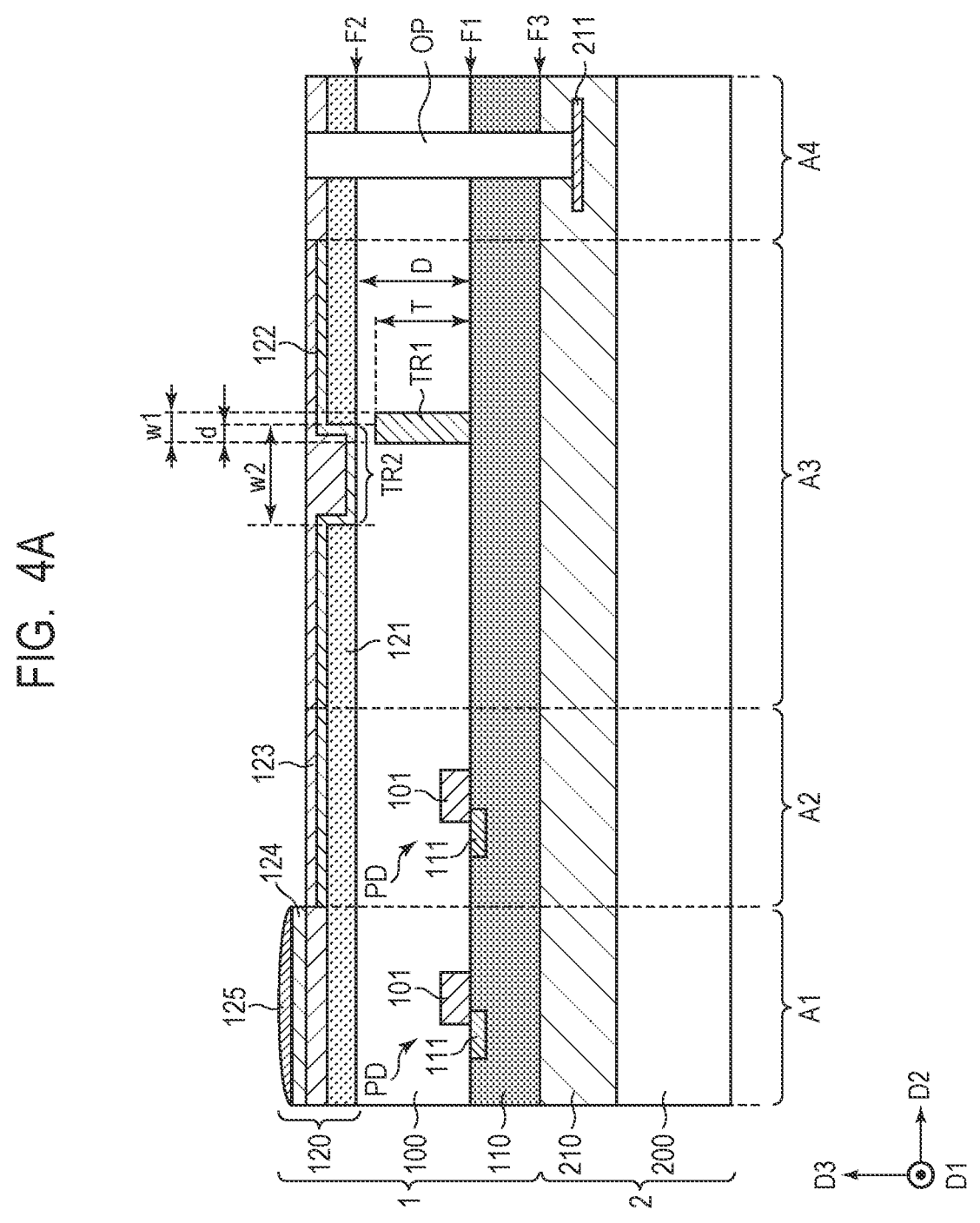
Figure 4B:
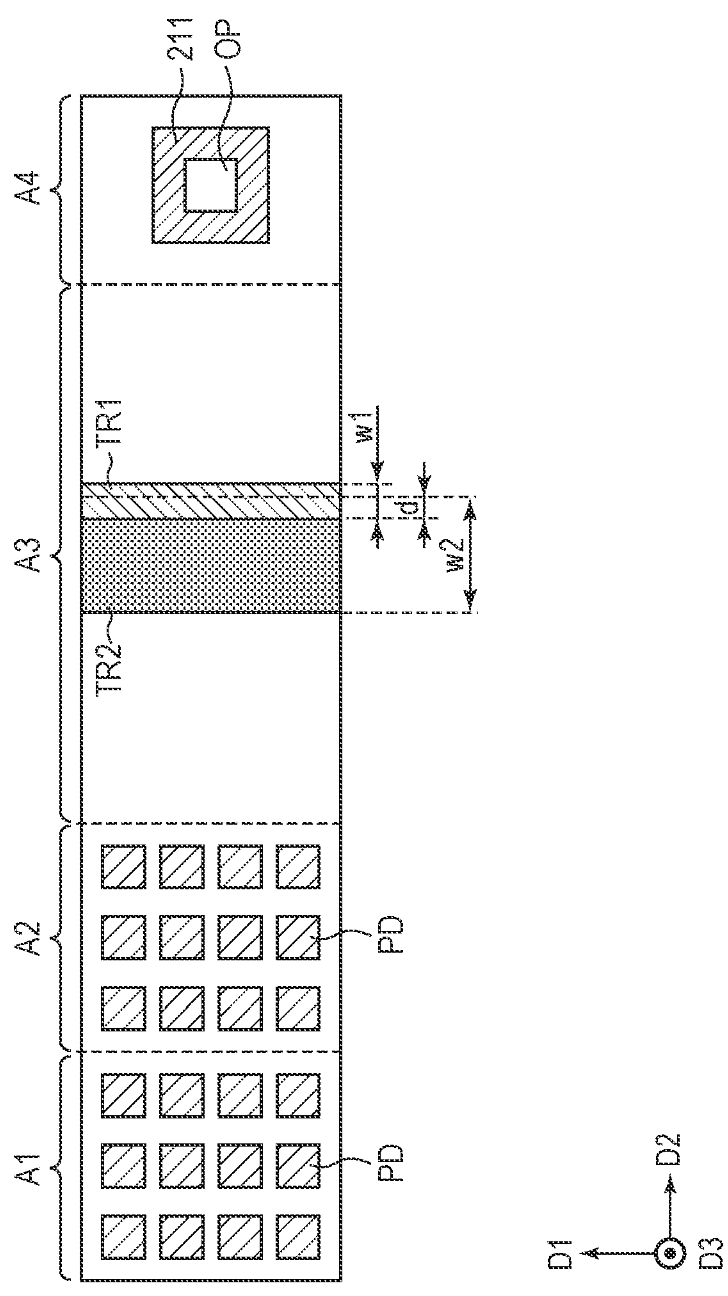
FIG. 4B is a plan view of the photoelectric conversion device according to the first embodiment.

FIG. 4A is a schematic sectional view of the photoelectric conversion device according to the present embodiment and illustrates a cross section taken along the line I-I' of FIG. 3. FIG. 4B is a plan view of the photoelectric conversion device according to the present embodiment. FIG. 4B is a plan view corresponding to FIG. 4A. Note that, although only one pixel is illustrated in each of the light-receiving pixel region A1 and the first light-shielded region A2 of FIG. 4A and pixels of three rows by three columns are illustrated in each of the light-receiving pixel region A1 and the first light-shielded region A2 of FIG. 4B, the number of pixels may be the same between FIG. 4A and FIG. 4B in the actual implementation. Further, the number of pixels is not limited to that in the examples of FIG. 4A and FIG. 4B.

The photoelectric conversion device is formed of lamination structure of a substrate 1 and a substrate 2. The substrate 1 includes a semiconductor substrate 100, a wiring structure 110, and a layered structure 120. The substrate 2 includes a support substrate 200 and a structure 210.

The semiconductor substrate 100 is formed of a silicon or the like. The semiconductor substrate 100 has a face F1 and a face F2 opposed to the face F1. The photoelectric conversion unit PD having a diffusion layer 101 is formed on the face F1 of each of the light-receiving pixel region A1 and the first light-shielded region A2 of the semiconductor substrate 100.

In sectional view of FIG. 4A, a first trench structure TR1 extends from the face F1 toward the face F2 (in +D3 direction) in the second light-shielded region A3 of the semiconductor substrate 100. In the present embodiment, the end of the first trench structure TR1 does not reach the face F2. That is, the depth T of the first trench structure TR1 is smaller than the thickness D of the semiconductor substrate 100, and the end of the first trench structure TR1 is located distant by (D-T) from the face F2. Further, it is preferable that the depth T of the first trench structure TR1 be sufficiently large relative to the thickness D of the semiconductor substrate 100, and it is desirable that $D/2 \leq T$ be met, for example. This can enhance the effect of suppressing stray light.

Further, in planar view of FIG. 4B, the first trench structure TR1 extends in the alignment direction of the plurality of pad openings OP (D1 direction) in the second light-shielded region A3. Furthermore, in planar view of FIG. 3, the first trench structure TR1 may be formed so as to surround the first light-shielded region A2.

The first trench structure TR1 may be formed of a deep trench isolation alone or may be otherwise. For example, the first trench structure TR1 may be formed of two stages of a deep trench isolation and a shallow trench isolation.

When the first trench structure TR1 is formed of two stages of a deep trench isolation and a shallow trench isolation, the deep trench isolation is formed earlier than the shallow trench isolation. When a deep trench isolation is formed, a deep trench is first formed. Next, silicon nitride, silicon oxynitride, silicon oxide, air, or the like are embedded in the deep trench, and thereby the deep trench isolation is formed. On the other hand, when a shallow trench isolation is formed, a shallow trench is first formed. Then, silicon oxide is embedded in the shallow trench, and thereby the shallow trench isolation is formed. Accordingly, the first trench structure TR1 is formed in which the deep trench isolation extends from the bottom of the shallow trench isolation toward the face F2 (in +D3 direction) and which is made of the deep trench isolation and the shallow trench isolation.

A member having a different refractive index from the semiconductor substrate 100 is embedded inside the first trench structure TR1. For example, when the semiconductor substrate 100 is formed of silicon, a member of silicon nitride, silicon oxynitride, silicon oxide, air, or the like is embedded in the deep trench. Thereby, the first trench structure TR1 may be formed of the deep trench isolation alone. Further, silicon oxide is embedded in the shallow trench, and thereby the first trench structure TR1 formed of the shallow trench isolation alone may be formed.

The wiring structure 110 is provided on the face F1 of the semiconductor substrate 100. The wiring structure 110 is formed of an interlayer insulating film, wirings whose main component is copper or aluminum, contacts connected between the semiconductor substrate 100 and the wirings, vias connected between the wirings, and the like. Note that gate electrodes 111 are also formed in the layer of the wiring structure 110.

The layered structure 120 is provided on the face F2 of the semiconductor substrate 100. The layered structure 120 includes an insulating layer 121, a light-shielding film 122, an insulating film 123, a color filter 124, and a micro-lens 125.

The insulating layer 121 is formed so as to cover the face F2 of the semiconductor substrate and may be of a layered structure of a plurality of films. For example, the insulating layer 121 includes a first layer of aluminum oxide or hafnium oxide, a second layer of tantalum oxide, and a third layer of silicon oxide, and the first layer, the second layer, and the third layer are layered in this order on the face F2. The insulating layer 121 has a light transmitting property.

The light-shielding film 122 partially covers the surface of the insulating layer 121 and defines the first light-shielded region A2 and the second light-shielded region A3. The light-shielding film 122 may be made of aluminum, tungsten, or the like or may be made of aluminum containing a small amount of copper or the like. Further, the light-shielding film 122 may be a lamination of aluminum and titanium nitride or a lamination of titanium nitride and aluminum containing a small amount of copper.

The insulating film 123 covers the insulating layer 121 and the light-shielding film 122. The insulating film 123 is formed of silicon oxide or the like, for example, and the surface of the insulating film 123 may be planarized.

The color filter 124 is formed on the insulating film 123 in the light-receiving pixel region A1, and the micro-lens 125 is formed on the color filter 124. Any known materials can be used for the color filter 124 and the micro-lens 125.

Note that, although the layered structure 120 is formed of the insulating film 123, the color filter 124, and the micro-lens 125 in the present embodiment, the configuration of the layered structure 120 is not limited thereto. The layered structure 120 may take simple structure made of only the insulating film 123. Further, the layered structure 120 may further include an interlayer lens.

The second trench structure TR2 is formed in the insulating layer 121 in the second light-shielded region A3. In FIG. 4B, the second trench structure TR2 extends in the alignment direction of the plurality of pad openings OP (D1 direction) in the second light-shielded region A3 in the same manner as the first trench structure TR1. Furthermore, in FIG. 3, the second trench structure TR2 may be formed so as to surround the first light-shielded region A2 in the same manner as the first trench structure TR1. In FIG. 4A, the second trench structure TR2 extends from the surface of the insulating layer 121 toward the face F2 of the semiconductor substrate 100 and penetrates the insulating layer 121. The side face and the bottom face of the second trench structure TR2 are covered with the light-shielding film 122. Thus, stray light propagating from the pad opening OP to the insulating layer 121 and the semiconductor substrate 100 can be efficiently suppressed.

Further, in the planar view, the second trench structure TR2 and the first trench structure TR1 have portions overlapping each other. It is preferable that the overlapping width d of the first trench structure TR1 and the second trench structure TR2 be sufficiently large. For example, when the width w1 of the first trench structure TR1 is smaller than the width w2 of the second trench structure TR2, the overlapping width d may be a ratio of 1/2, 1/3, 1/4, or the like of the width w1. Note that the width w1 of the first trench structure TR1, the width w2 of the second trench structure TR2, and the overlapping width d are not limited to those of the example in FIG. 4A and FIG. 4B. For example, it is even possible that the width w1 of the first trench structure TR1 is larger than the width w2 of the second trench structure TR2.

Note that, in the example of FIG. 4A, the second trench structure TR2 penetrates the insulating layer 121, and the bottom face of the second trench structure TR2 is continuous to the face F2 of the semiconductor substrate 100. However, the bottom face of the second trench structure TR2 is not necessarily required to be continuous to the face F2. For example, the second trench structure TR2 extends to inside of the semiconductor substrate 100, and the bottom face of the second trench structure TR2 may be located more inside the semiconductor substrate 100 than the face F2.

The support substrate 200 is formed of silicon or the like. The support substrate 200 may be a semiconductor substrate in which no element is formed or may be a substrate in which a circuit such as an application specific integrated circuit (ASIC), a memory, or the like is formed.

The structure 210 is provided on the surface of the support substrate 200. When no circuit element such as a transistor is formed in the support substrate 200, the structure 210 may include only the insulating film. Further, when circuit elements are formed in the support substrate 200, the structure 210 may include a wiring layer and an interlayer insulating film. The semiconductor substrate 100 and the support substrate 200 are joined at the surface of the wiring structure 110 and the surface of the structure 210 as an interface F3.

The bonding pad 211 is formed of aluminum, copper, or the like and formed inside the structure 210 in the peripheral region A4. Note that the bonding pad 211 may be formed inside the wiring structure 110 or may be formed in both of the wiring structure 110 and the structure 210.

The pad opening OP penetrates the layered structure 120, the semiconductor substrate 100, and the wiring structure 110 in the peripheral region A4 and, further, reaches the bonding pad 211 inside the structure 210. Accordingly, a part of the bonding pad 211 is exposed by the pad opening OP. Note that, in the pad opening OP, a portion passing through the semiconductor substrate 100 may be surrounded by an isolation wall (not illustrated) made of an insulating film.

As described above, the second trench structure TR2 and the first trench structure TR1 are arranged so as to have portions overlapping each other in the planar view of the semiconductor substrate 100. The spacing between the second trench structure TR2 and the first trench structure TR1 is narrower compared to a case where the second trench structure TR2 and the first trench structure TR1 do not overlap each other in the planar view. That is, the light propagation path in the semiconductor substrate 100 and the insulating layer 121 is made narrower. It is thus possible to efficiently suppress stray light incident from the pad opening OP from propagating the semiconductor substrate 100 and the insulating layer 121 and entering the first light-shielded region A2.

A manufacturing method of the photoelectric conversion device of the present embodiment will be described with reference to FIG. 5A to FIG. 5I. FIG. 5A to FIG. 5I are schematic sectional views illustrating the manufacturing method of the photoelectric conversion device according to the present embodiment.

Figure 5A:
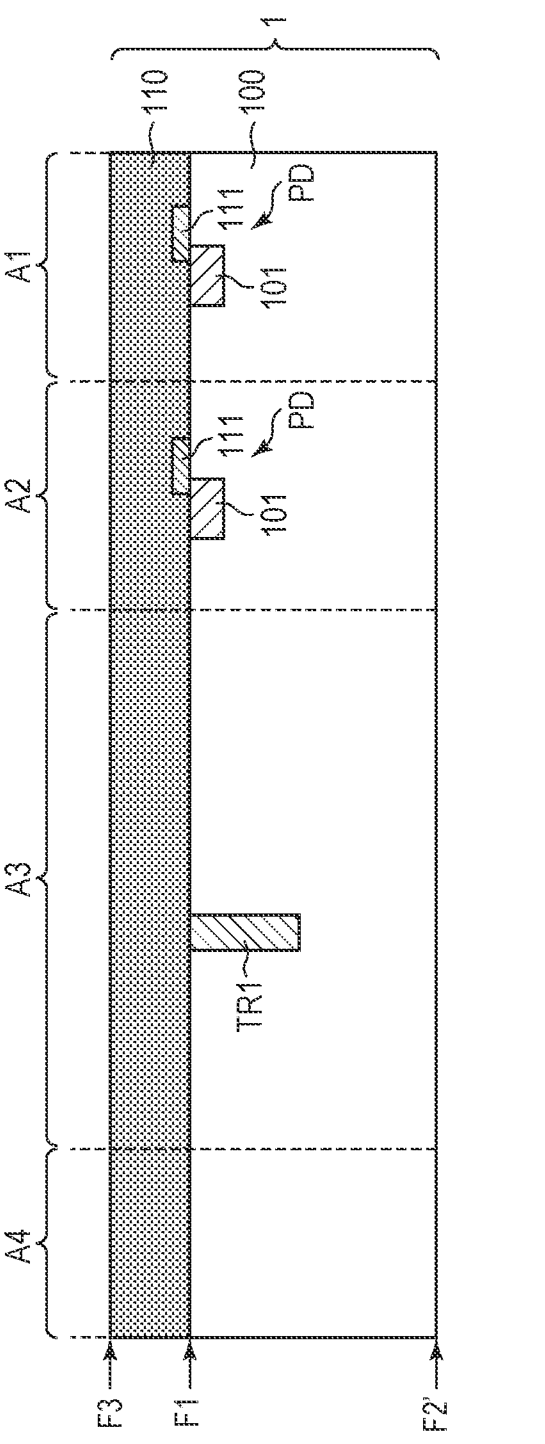
FIG. 5A is a schematic sectional view illustrating a manufacturing method of the photoelectric conversion device according to the first embodiment.
Figure 5A:
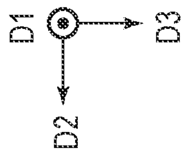

First, as illustrated in FIG. 5A, the semiconductor substrate 100 made of silicon is prepared. The semiconductor substrate 100 has the face F1 and a face F2' opposed to the face F1.

Next, the first trench structure TR1 is formed in the second light-shielded region A3 of the semiconductor substrate 100. The first trench structure TR1 extends from the face F1 toward the face F2' (in +D3 direction) of the semiconductor substrate 100.

Next, the diffusion layer 101 is formed by ion implantation in the face F1 in the light-receiving pixel region A1 and the first light-shielded region A2 of the semiconductor substrate 100. Electrodes such as the gate electrode 111 or wirings are formed by patterning on the face F1 of the semiconductor substrate 100. The gate electrode 111 may be formed of polysilicon, for example. In such a way, pixels including the photoelectric conversion units PD are formed in the light-receiving pixel region A1 and the first light-shielded region A2.

The wiring structure 110 is formed on the face F1 of the semiconductor substrate 100. The wiring structure 110 may include an interlayer insulating film, wirings whose main component is copper or aluminum, contacts connected between the semiconductor substrate 100 and the wirings, and vias connected between the wirings.

Figure 5B:
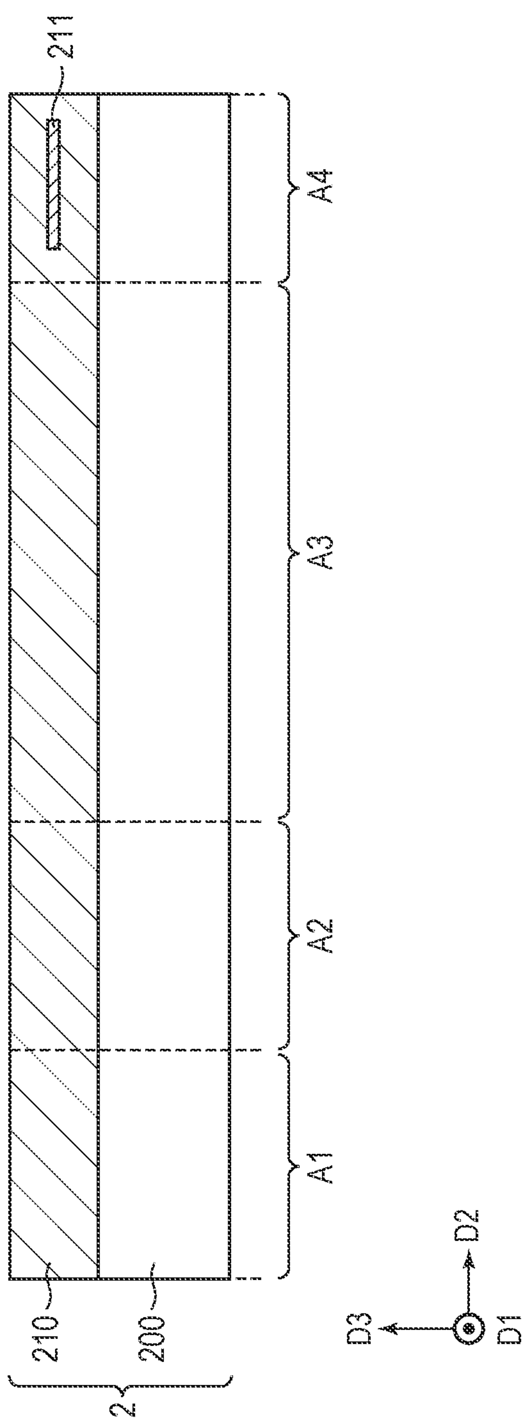
FIG. 5B is a schematic sectional view illustrating the manufacturing method of the photoelectric conversion device according to the first embodiment.

Next, as illustrated in FIG. 5B, the support substrate 200 is prepared. The support substrate 200 may be a silicon substrate in which no circuit is formed or may be a substrate in which a circuit such as an ASIC, a memory, or the like is formed. The structure 210 including a wiring layer, an interlayer insulating film, and the like is provided on the surface of the support substrate 200. The bonding pads 211 electrically connected to a circuit unit is formed in the structure 210.

Figure 5C:
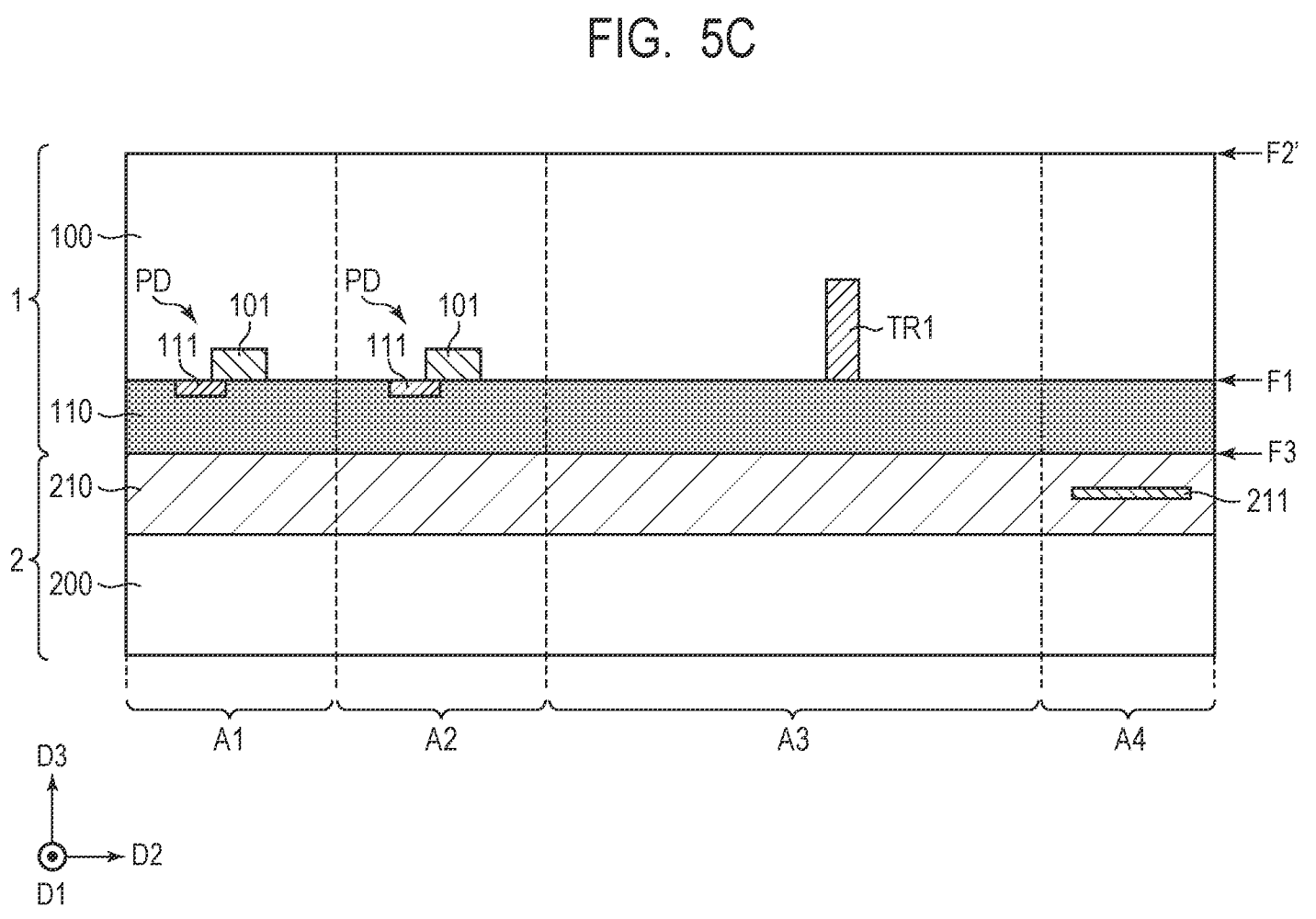

Next, as illustrated in FIG. 5C, the substrate 1 and the substrate 2 are joined. Specifically, the surface of the wiring structure 110 of the semiconductor substrate 100 and the surface of the structure 210 of the support substrate 200 are attached to each other as the interface F3. The joining method of the substrates is not limited, and a so-called cold joining method of activating and joining the substrate surfaces by plasma irradiation may be used. Furthermore, the substrate 1 and the substrate 2 may be joined by adhesion of the wiring structure 110 and the structure 210 via an adhesive joining member or the like, for example.

Figure 5D:
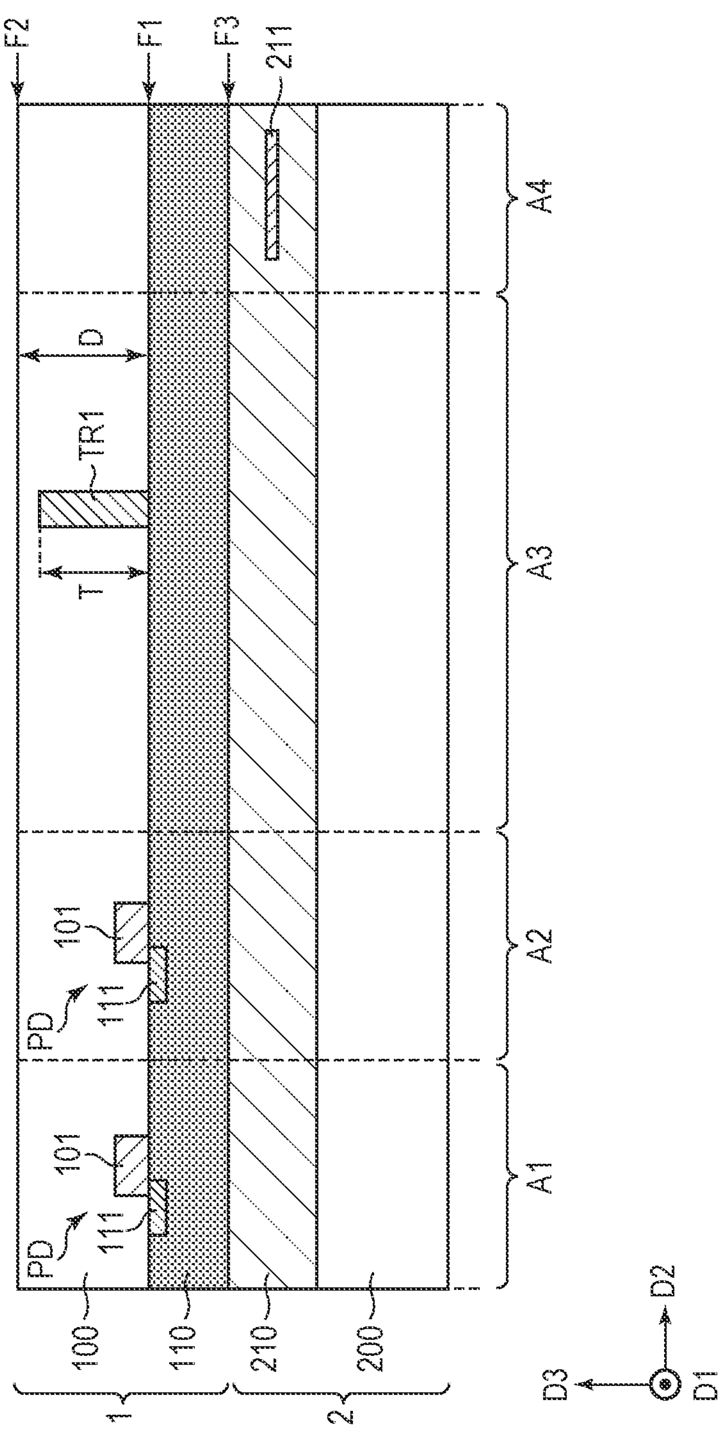
FIG. 5D is a schematic sectional view illustrating the manufacturing method of the photoelectric conversion device according to the first embodiment.

Next, as illustrated in FIG. 5D, the semiconductor substrate 100 is thinned from the face F2' side, and thereby a new face F2 of the semiconductor substrate 100 is formed. The semiconductor substrate 100 may be thinned so that the equation $D/2 \leq T$ described above is met. Note that, for the process of thinning, a grinder, a wet etcher, a CMP system, or the like may be used.

Figure 5E:
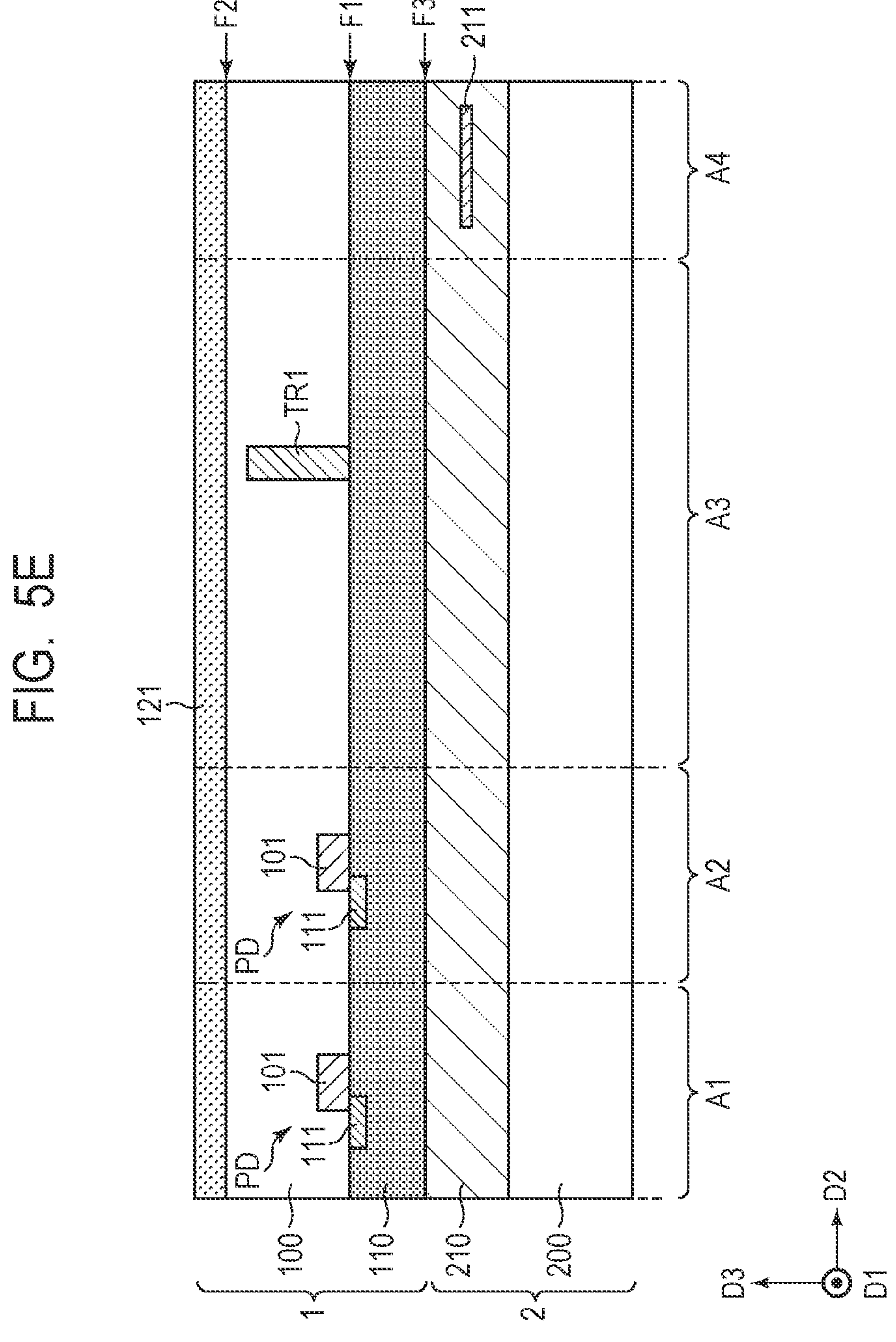
FIG. 5E is a schematic sectional view illustrating the manufacturing method of the photoelectric conversion device according to the first embodiment.

Next, as illustrated in FIG. 5E, the insulating layer 121 is formed on the face F2 of the semiconductor substrate 100. The insulating layer 121 may be of lamination structure of a plurality of films.

Figure 5F:
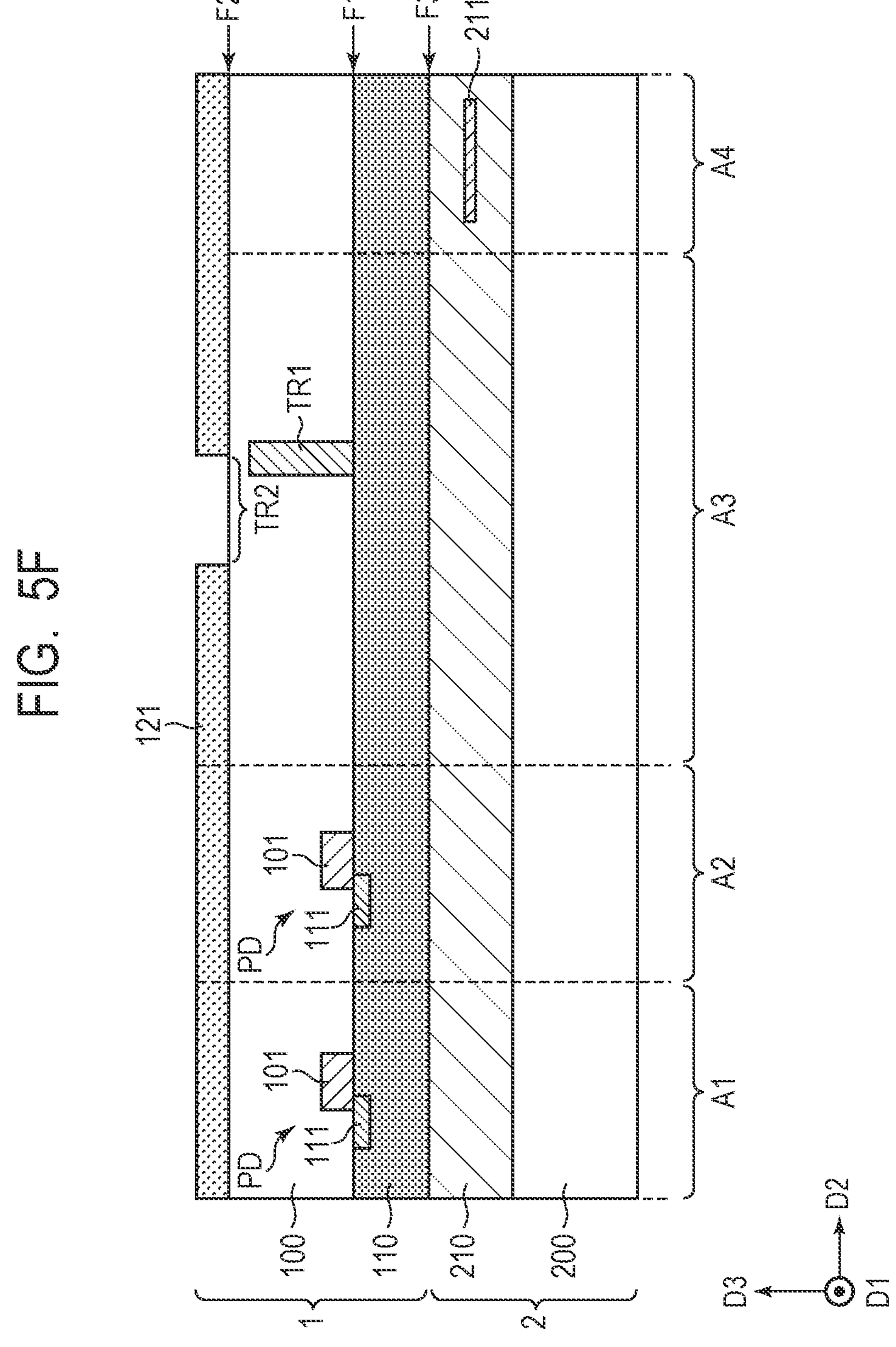
FIG. 5F is a schematic sectional view illustrating the manufacturing method of the photoelectric conversion device according to the first embodiment.

Next, as illustrated in FIG. 5F, the second trench structure TR2 is formed in the second light-shielded region A3 so as to penetrate the insulating layer 121. As described above, in the planar view, the second trench structure TR2 partially overlaps the first trench structure TR1.

Figure 5G:
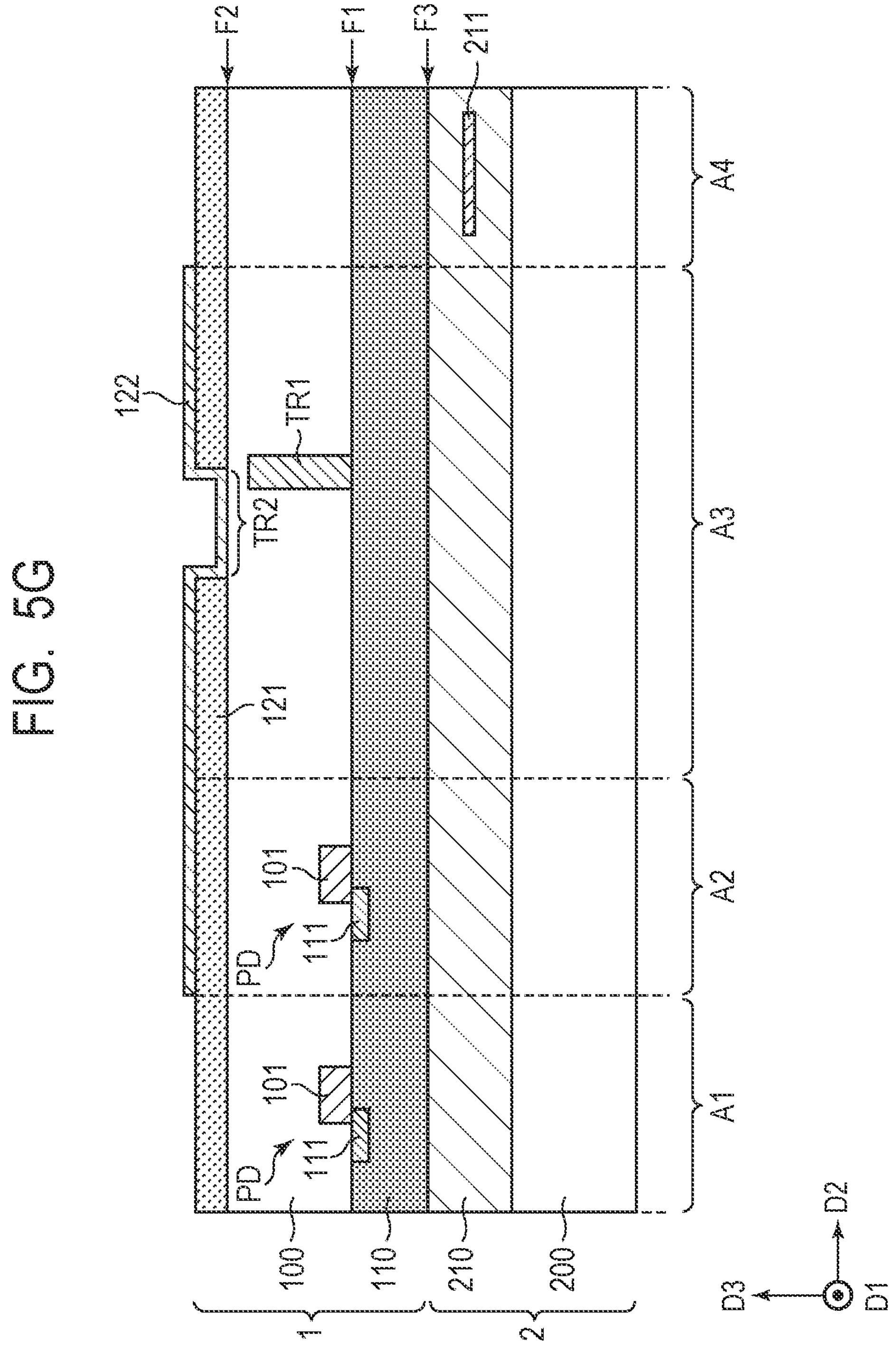
FIG. 5G is a schematic sectional view illustrating the manufacturing method of the photoelectric conversion device according to the first embodiment.

Next, as illustrated in FIG. 5G, the light-shielding film 122 is formed so as to cover the surface of the insulating layer 121 and the side face and the bottom face of the second trench structure TR2. The light-shielding film 122 in a region other than the first light-shielded region A2 and the second light-shielded region A3 is removed by patterning, and the light-shielding film 122 remains in the first light-shielded region A2 and the second light-shielded region A3.

Figure 5H:
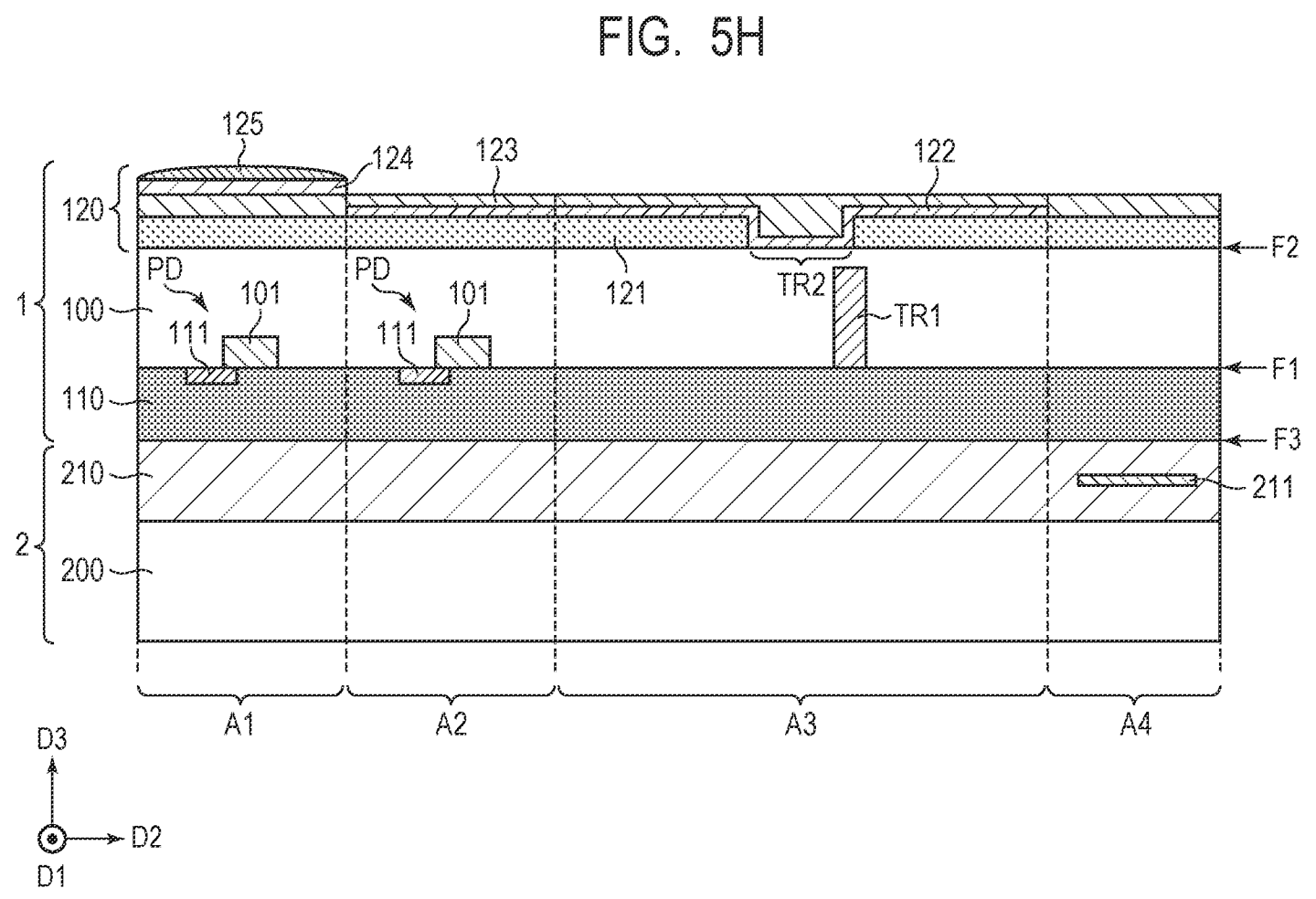

Next, as illustrated in FIG. 5H, the insulating layer 121 and the light-shielding film 122 are covered with the insulating film 123, and the surface of the insulating film 123 is planarized. Furthermore, the color filter 124 and the micro-lens 125 are formed on the insulating film 123 in the light-receiving pixel region A1. Accordingly, the layered structure 120 formed of the insulating layer 121, the light-shielding film 122, the insulating film 123, the color filter 124, and the micro-lens 125 is formed on the face F2 of the semiconductor substrate 100.

Figure 5I:
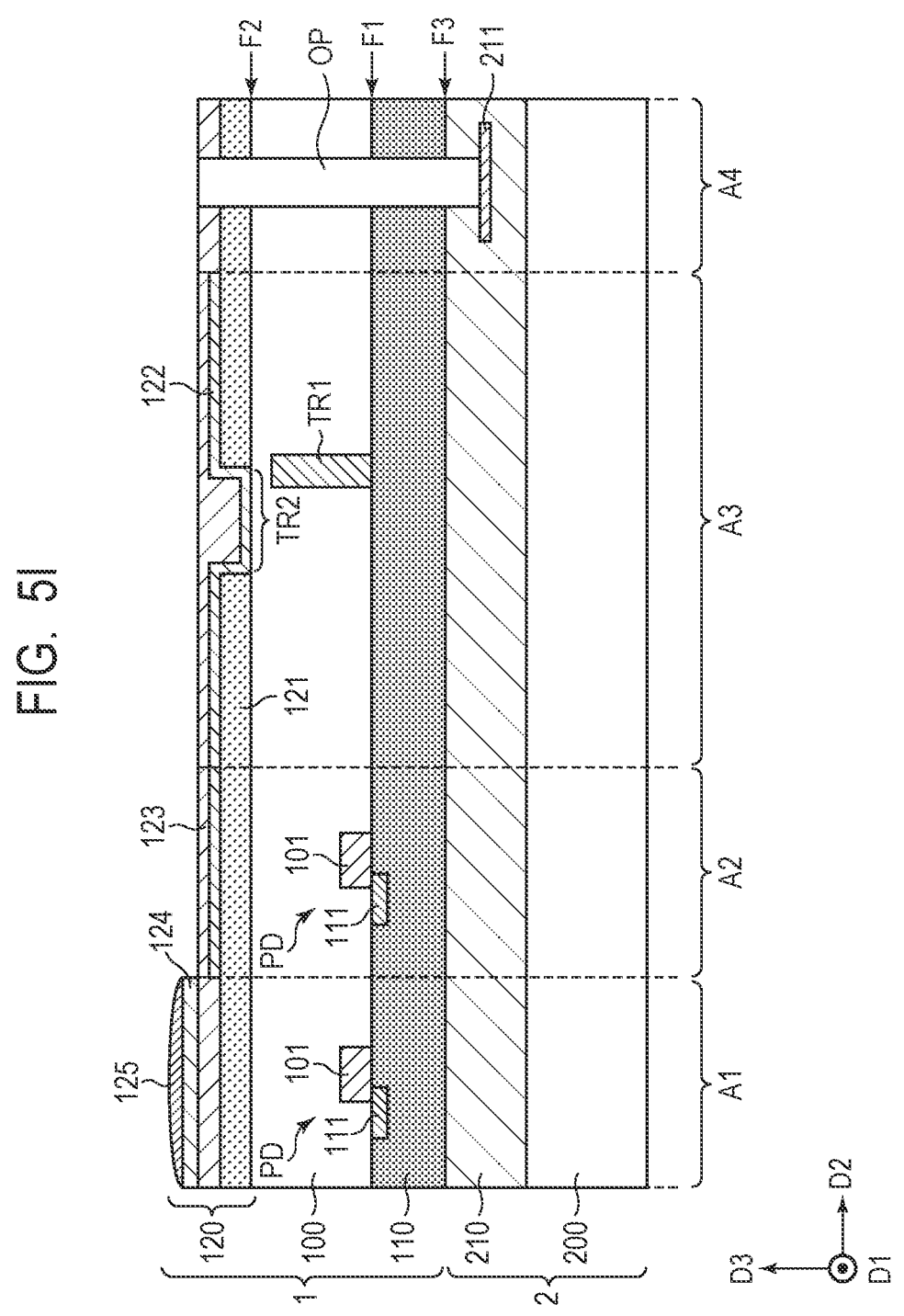

Next, as illustrated in FIG. 5I, in the peripheral region A4, the pad opening OP extending from the surface of the layered structure 120 to inside of the structure 210 is formed. Accordingly, a part of the bonding pad 211 provided on the face F1 side of the semiconductor substrate 100 is exposed. The photoelectric conversion device according to the present embodiment is manufactured by the method set forth.

The photoelectric conversion device described in the above embodiment can also be configured as in the following embodiments. Note that, in each embodiment, references common to the references provided in the drawings of the first embodiment refer to the same objects.

Second Embodiment

Figure 6:
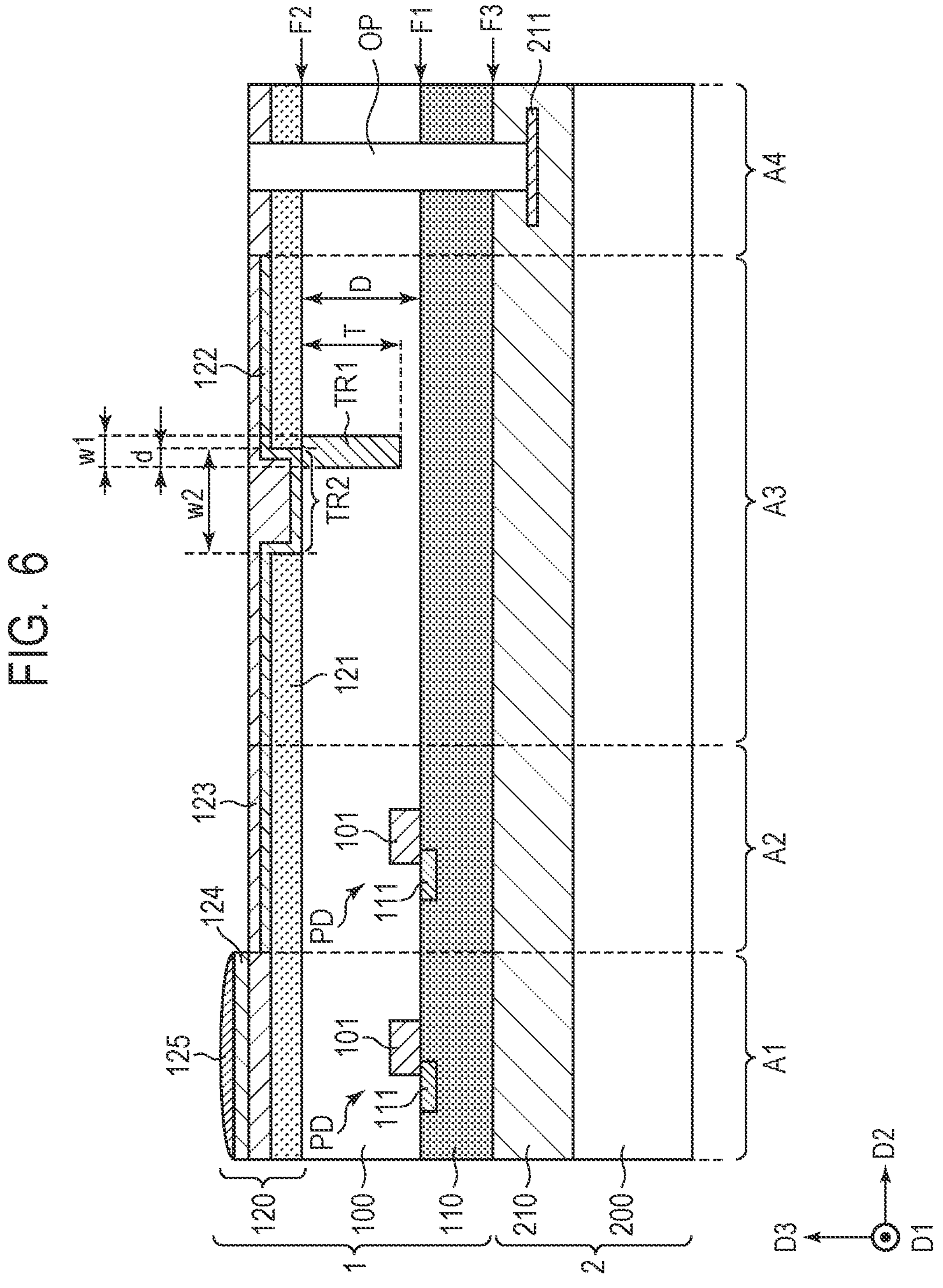
FIG. 6 is a schematic sectional view of a photoelectric conversion device according to a second embodiment.

FIG. 6 is a schematic sectional view of a photoelectric conversion device according to the present embodiment. The present embodiment will be described below mainly for features different from those in the first embodiment.

The photoelectric conversion device according to the present embodiment differs from the case of the first embodiment in the position of the first trench structure TR1 in the semiconductor substrate 100. As illustrated in FIG. 6, in the second light-shielded region A3 of the semiconductor substrate 100, unlike the case of the first embodiment, the first trench structure TR1 extends from the face F2 toward the face F1 (in −D3 direction), and the end of the first trench structure TR1 is located distant by (D-T) from the face F1. Also in the present embodiment, it is preferable that the depth T of the first trench structure TR1 be sufficiently large relative to the thickness D of the semiconductor substrate 100, and it is desirable that D/2≤T be met, for example. This can enhance the effect of suppressing stray light.

Next, the manufacturing method of the photoelectric conversion device in the present embodiment will be described in comparison with the first embodiment. In the present embodiment, unlike the case of the first embodiment, the first trench structure TR1 is not formed in the process of FIG. 5A. Instead, after the thinning of the semiconductor substrate 100 of FIG. 5D, the first trench structure TR1 is formed so as to extend from the face F2 to the face F1. Next, in the process of FIG. 5E, the insulating layer 121 is formed on the end of the first trench structure TR1 and the face F2.

As described above, also in the photoelectric conversion device according to the present embodiment, stray light propagating from the pad opening OP into the semiconductor substrate 100 and the insulating layer 121 can be efficiently suppressed in the same manner as the case of the first embodiment.

Third Embodiment

Figure 7:
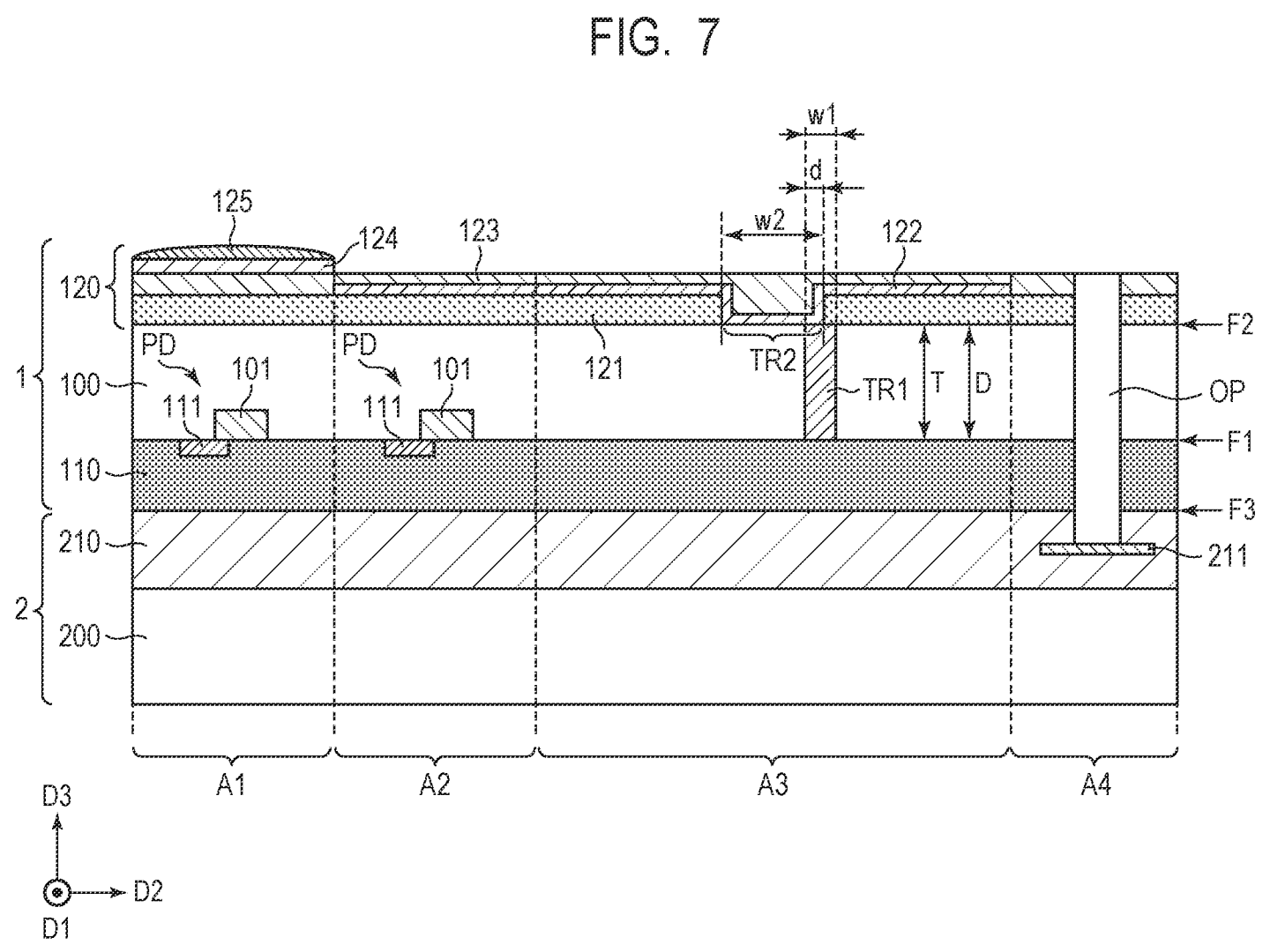

FIG. 7 is a schematic sectional view of a photoelectric conversion device according to the present embodiment. The present embodiment will be described below mainly for features different from those in the first embodiment.

The photoelectric conversion device according to the present embodiment differs from the above embodiments in the depth of the first trench structure TR1 inside the semiconductor substrate 100. As illustrated in FIG. 7, the first trench structure TR1 is formed so as to penetrate the semiconductor substrate 100 in the D3 direction in the second light-shielded region A3 of the semiconductor substrate 100. In the present embodiment, the depth T of the first trench structure TR1 matches the thickness D of the semiconductor substrate 100, and D=T is met. Further, in the planar view, the second trench structure TR2 and the first trench structure TR1 have an overlapping width d.

According to the photoelectric conversion device according to the present embodiment, the first trench structure TR1 penetrates the semiconductor substrate 100 in the D3 direction, and the first trench structure TR1 is continuous to the second trench structure TR2. Thus, compared to the case of the above embodiments, stray light from the pad opening OP can be more effectively suppressed.

Fourth Embodiment

Figure 8A:
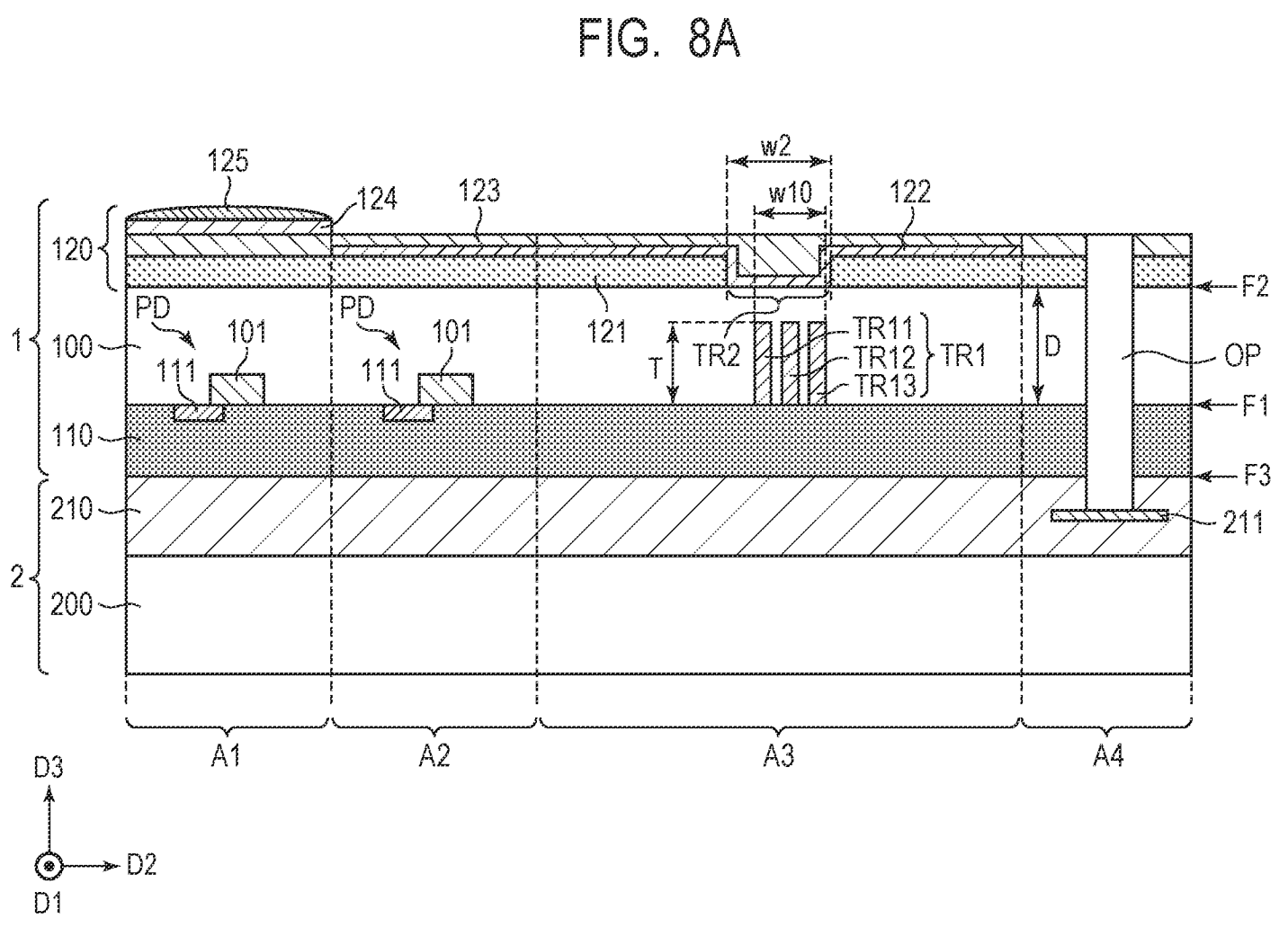
Figure 8B:
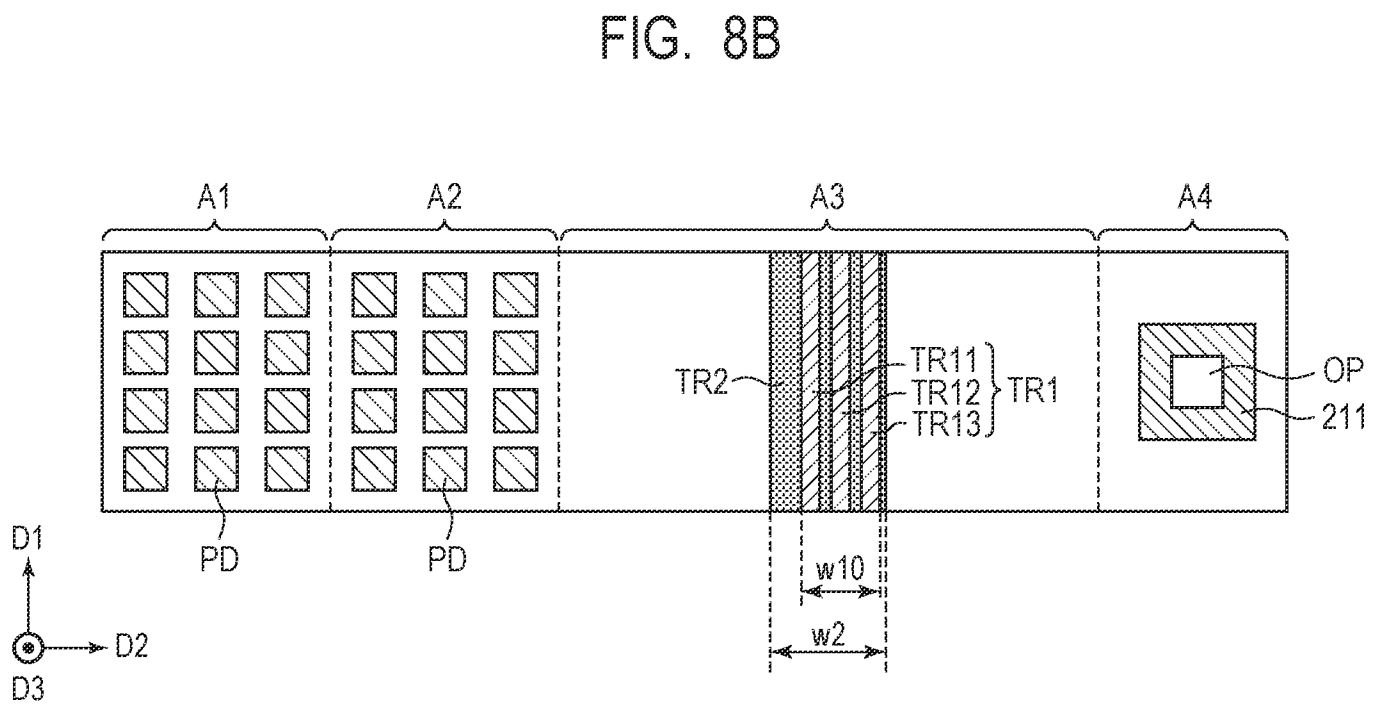

FIG. 8A is a schematic sectional view of a photoelectric conversion device according to the present embodiment, and FIG. 8B is a plan view of the photoelectric conversion device according to the present embodiment. The present embodiment will be described below mainly for features different from those in the first embodiment.

In the present embodiment, the first trench structure TR1 is formed of a plurality of trenches TR11 to TR13. As illustrated in FIG. 8A, the plurality of trenches TR11 to TR13 extend from the face F1 toward the face F2 (in +D3 direction), and the ends of the plurality of trenches TR11 to TR13 are located distant by (D-T) from the face F2. Also in the present embodiment, it is desirable that D/2≤T be met in order to effectively suppress stray light. This can enhance the effect of suppressing stray light.

In FIG. 8B, each of the plurality of trenches TR11 to TR13 has a predetermined width and are aligned at a predetermined interval. The plurality of trenches TR11 to TR13 do not intersect each other and are arranged in parallel.

Note that the plurality of trenches TR11 to TR13 may be formed extending from the face F2 toward the face F1 (in −D3 direction) in the same manner as in the second embodiment. Further, the plurality of trenches TR11 to TR13 may be formed so as to penetrate the semiconductor substrate 100 in the same manner as in the third embodiment. Furthermore, the number of trenches forming the first trench structure TR1 is not limited to three and may be two or four or greater. An increase in the number of trenches further enhances the effect of suppressing stray light.

In the present embodiment, the first trench structure TR1 has a larger width w10 than the width w1 of the above embodiments, and the width w10 is sufficiently large in the width w2 of the second trench structure TR2. Thus, in the planar view, the portion where the first trench structure TR1 and the second trench structure TR2 overlap each other is also increased. Further, as described above, since the first trench structure TR1 is formed of a plurality of trenches, stray light can be more effectively suppressed. Note that not all of the trenches TR11 to TR13 needs to overlap the second trench structure TR2 in the planar view. For example, in the planar view, only a part of the trenches TR11 to TR13 may overlap the second trench structure TR2. Further, the width w10 of the first trench structure TR1 may be formed larger than the width w2 of the second trench structure TR2.

As described above, according to the photoelectric conversion device of the present embodiment, since the first trench structure TR1 is formed of the plurality of trenches TR11 to TR13, stray light can be more effectively suppressed.

Fifth Embodiment

Figure 9A:
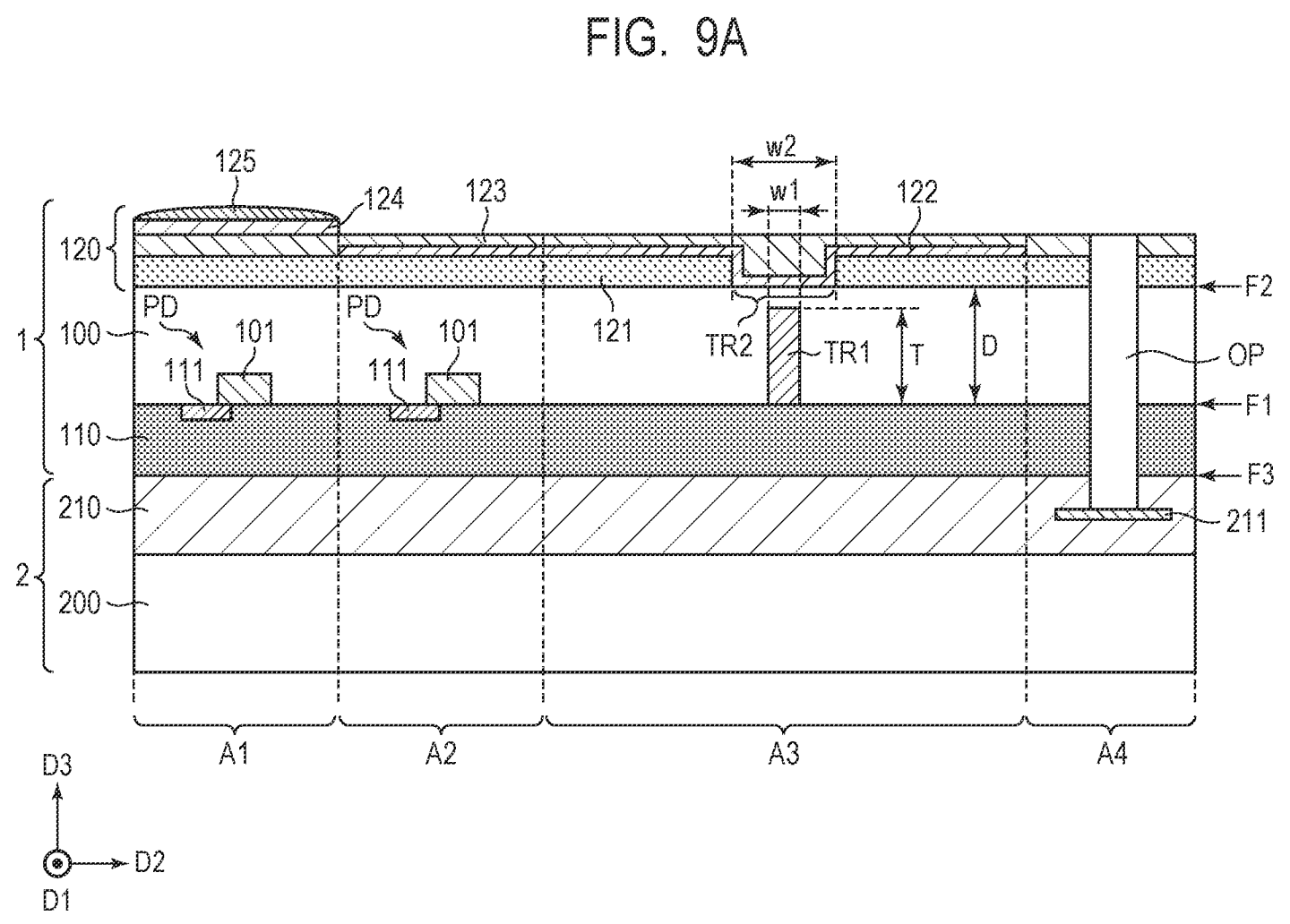
Figure 9B:
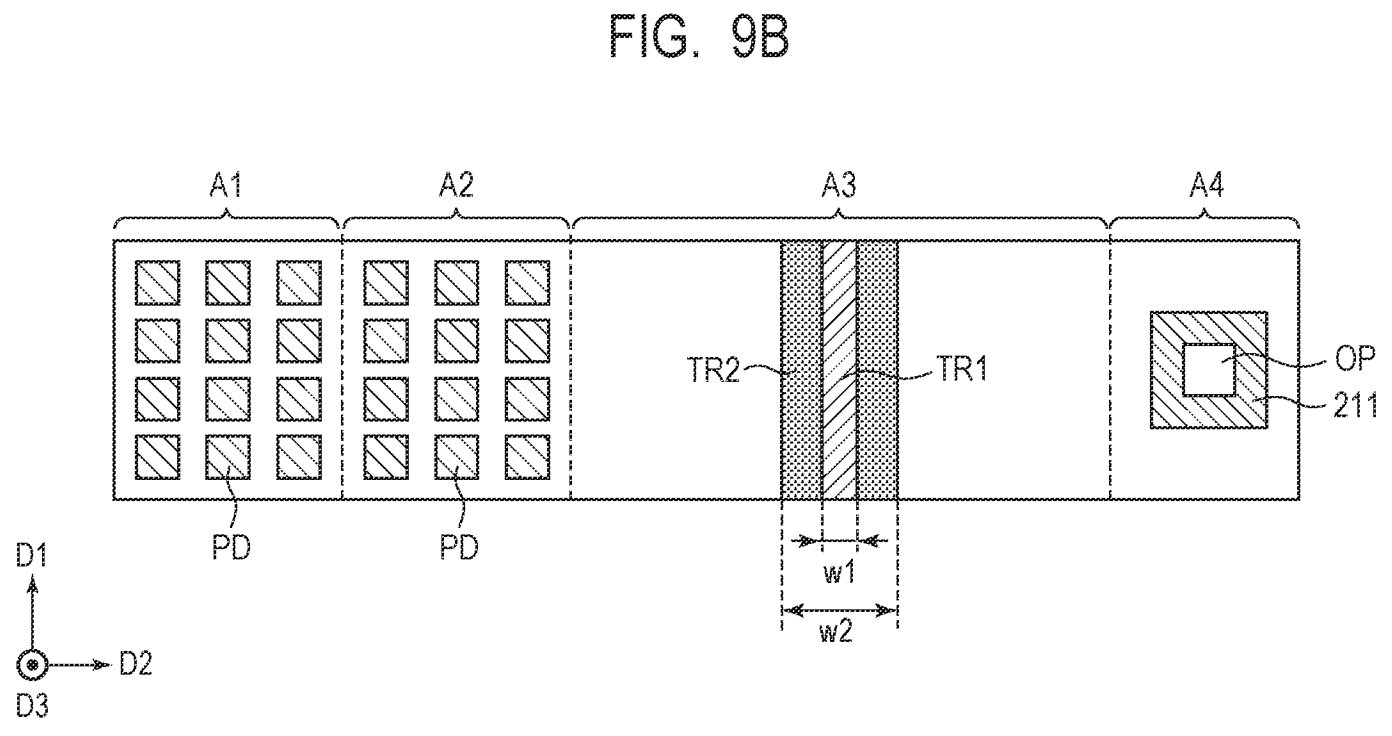

FIG. 9A is a schematic sectional view of a photoelectric conversion device according to the present embodiment, and FIG. 9B is a plan view of the photoelectric conversion device according to the present embodiment. The present embodiment will be described below mainly for features different from those in the first embodiment.

In the planar view, the entire first trench structure TR1 overlaps the second trench structure TR2. Furthermore, the first trench structure TR1 is located at the center of the second trench structure TR2 in the width direction (D2) of the first trench structure TR1 and the second trench structure TR2. Thus, the overlapping width of the first trench structure TR1 and the second trench structure TR2 is wider than that of the first embodiment, and the stray light suppression effect can be further enhanced.

Also in the present embodiment, the first trench structure TR1 may be formed extending from the face F2 toward the face F1 (in −D3 direction) in the same manner as in the second embodiment. Further, the first trench structure TR1 may be formed so as to penetrate the semiconductor substrate 100 in the same manner as the third embodiment.

Sixth Embodiment

Figure 10:
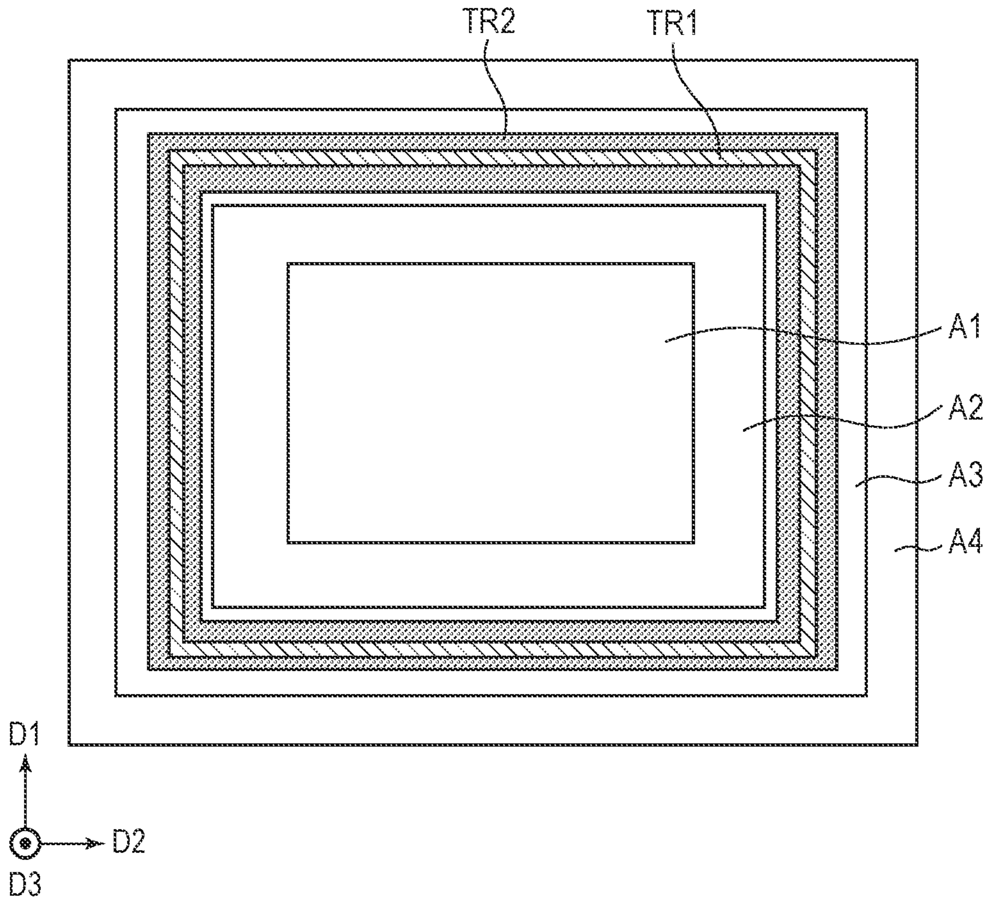
FIG. 10 is a plan view of a photoelectric conversion device according to a sixth embodiment.

FIG. 10 is a plan view of a photoelectric conversion device according to the present embodiment. The present embodiment will be described below mainly for features different from those in the first embodiment.

FIG. 10 illustrates the light-receiving pixel region A1, the first light-shielded region A2, the second light-shielded region A3, and the peripheral region A4. The first light-shielded region A2 is arranged around the light-receiving pixel region A1 in the same manner as in the first embodiment. Further, the second light-shielded region A3 is arranged around the first light-shielded region A2, and the peripheral region A4 is arranged around the second light-shielded region A3. The first trench structure TR1 and the second trench structure TR2 are formed around the first light-shielded region A2 in the planar view, and the entire first trench structure TR1 overlaps the second trench structure TR2 in the planar view. That is, the overlapping part of the first trench structure TR1 and the second trench structure TR2 is formed so as to surround the first light-shielded region A2. Stray light incident from the pad opening OP may propagate in various directions in the peripheral region A4 and the second light-shielded region A3. According to the present embodiment, the overlapping part of the first trench structure TR1 and the second trench structure TR2 can effectively suppress such stray light from entering the first light-shielded region A2.

Seventh Embodiment

Figure 11:
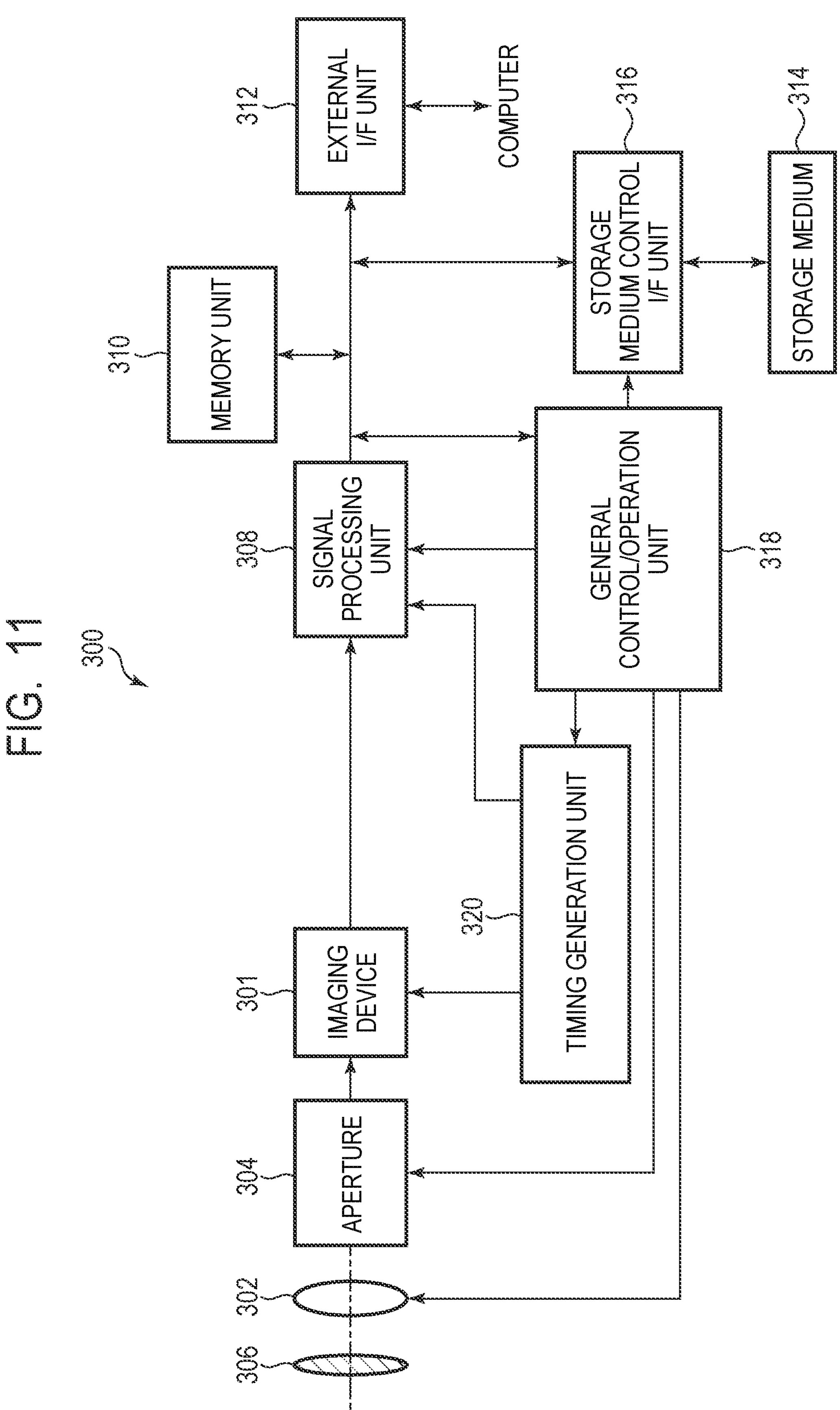
FIG. 11 is a block diagram illustrating a general configuration of an imaging system according to a seventh embodiment.

An imaging system according to the present embodiment will be described. FIG. 11 is a block diagram illustrating a general configuration of the imaging system according to the present embodiment. An imaging system 300 illustrated in FIG. 11 as an example has an imaging device 301, a lens 302 that captures an optical image of a subject onto the imaging device 301, an aperture 304 that can change the amount of light passing through the lens 302, and a barrier 306 used for protecting the lens 302. The lens 302 and the aperture 304 correspond to an optical system that converges light onto the imaging device 301. The imaging device 301 is the photoelectric conversion device described in any of the first to sixth embodiments and converts an optical image captured by the lens 302 into image data.

The imaging system 300 has a signal processing unit 308 that processes output signals output from the imaging device 301. The signal processing unit 308 generates image data from digital signals output by the imaging device 301. Further, the signal processing unit 308 performs operations of various correction or compression where necessary and performs an operation to output image data. The imaging device 301 may include an AD conversion unit that generates a digital signal processed by the signal processing unit 308. The AD conversion unit may be formed in the semiconductor layer (semiconductor substrate) in which the photoelectric conversion units of the imaging device 301 are formed or may be formed in a separate semiconductor substrate from the semiconductor layer in which the photoelectric conversion units of the imaging device 301 are formed. Further, the signal processing unit 308 may be formed in the same semiconductor substrate as the imaging device 301.

The imaging system 300 further has a memory unit 310 used for temporarily storing image data and an external interface unit (external I/F unit) 312 used for communicating with an external computer or the like. The imaging system 300 further has a storage medium 314 such as a semiconductor memory used for storage or reading of imaging data and a storage medium control interface unit (storage medium control OF unit) 316 used for storage or reading to the storage medium 314. Note that the storage medium 314 may be built in the imaging system 300 or may be removable.

The imaging system 300 further has a general control/operation unit 318 that controls various calculation and the overall digital still camera and a timing generation unit 320 that outputs various timing signals to the imaging device 301 and the signal processing unit 308. Herein, the timing signal or the like may be input externally, and the imaging system 300 needs to have at least the imaging device 301 and the signal processing unit 308 that processes output signals output from the imaging device 301.

The imaging device 301 outputs imaging signals to the signal processing unit 308. The signal processing unit 308 applies predetermined signal processing on imaging signals output from the imaging device 301 to output image data. The signal processing unit 308 uses imaging signals to generate an image.

As described above, according to the present embodiment, the imaging system to which the photoelectric conversion device according to any of the first to sixth embodiments is applied can be realized.

Eighth Embodiment

Figures 12A, 12B:
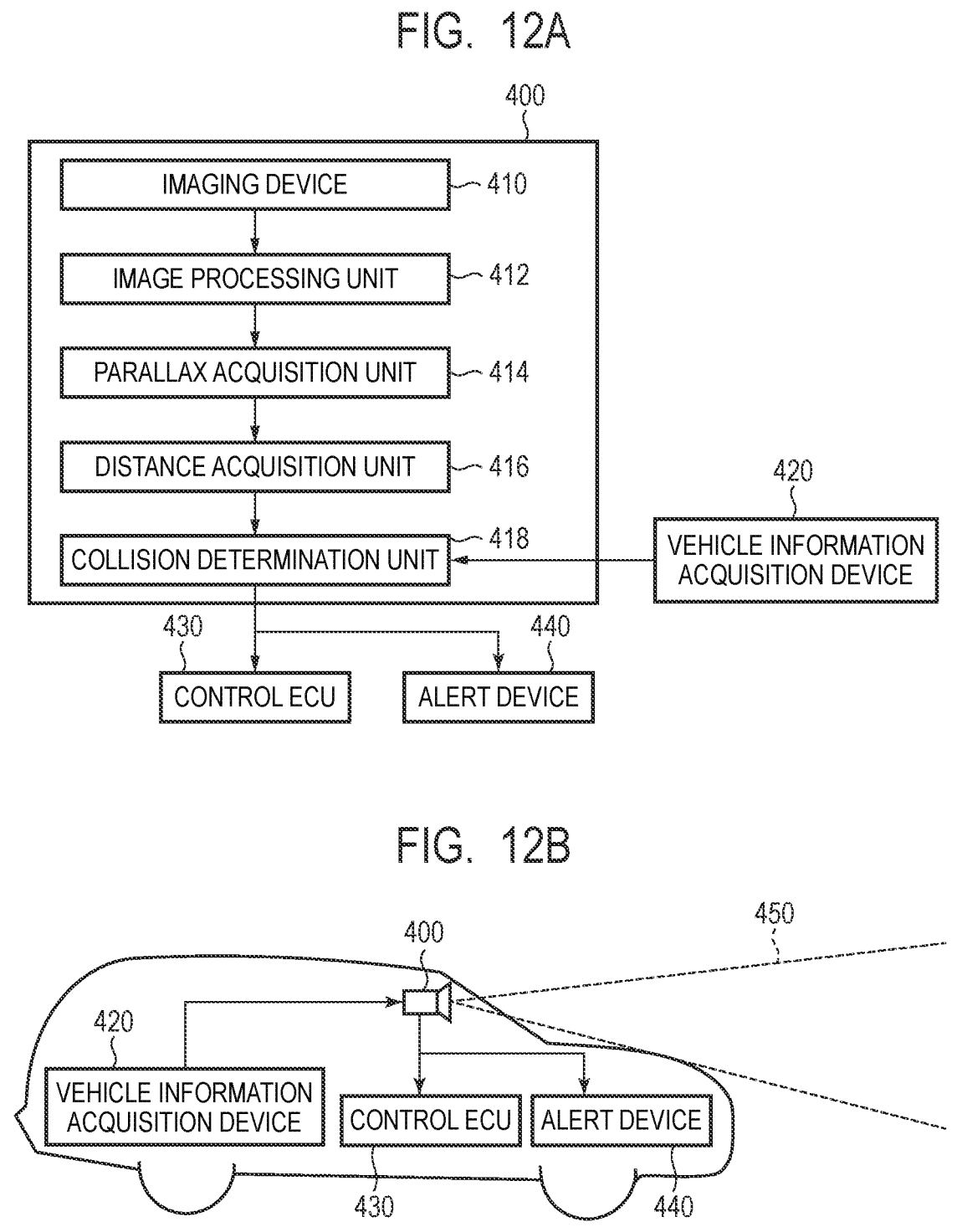

An imaging system and a moving unit according to the present embodiment will be described. FIG. 12A and FIG. 12B are a diagram illustrating a configuration of the imaging system and the moving unit according to the present embodiment.

FIG. 12A illustrates an example of an imaging system related to an on-vehicle camera. An imaging system 400 has an imaging device 410. The imaging device 410 is the photoelectric conversion device described in any of the above first to sixth embodiment. The imaging system 400 has an image processing unit 412 that performs image processing on a plurality of image data acquired by the imaging device 410 and a parallax acquisition unit 414 that calculates a parallax (a phase difference of parallax images) from the plurality of image data acquired by the imaging system 400. Further, the imaging system 400 has a distance acquisition unit 416 that calculates a distance to an object based on the calculated parallax and a collision determination unit 418 that determines whether or not there is a collision possibility based on the calculated distance. Herein, the parallax acquisition unit 414 and the distance acquisition unit 416 represent an example of a distance information acquisition unit that acquires distance information on the distance to an object. That is, the distance information is information on a parallax, a defocus amount, a distance to an object, or the like. The collision determination unit 418 may use any of the distance information to determine the collision possibility. The distance information acquisition unit may be implemented by dedicatedly designed hardware or may be implemented by a software module. Further, the distance information acquisition unit may be implemented by a field programmable gate array (FPGA), an application specific integrated circuit (ASIC), or the like or may be implemented by a combination thereof.

The imaging system 400 is connected to the vehicle information acquisition device 420 and can acquire vehicle information such as a vehicle speed, a yaw rate, a steering angle, or the like. Further, the imaging system 400 is connected to a control ECU 430, which is a control unit that outputs a control signal for causing a vehicle to generate braking force based on a determination result by the collision determination unit 418. Further, the imaging system 400 is also connected to an alert device 440 that issues an alert to the driver based on a determination result by the collision determination unit 418. For example, when the collision possibility is high as the determination result of the collision determination unit 418, the control ECU 430 performs vehicle control to avoid a collision or reduce damage by applying a brake, retracting an accelerator, suppressing engine power, or the like. The alert device 440 alerts a user by sounding an alert such as a sound, displaying alert information on a screen of a car navigation system or the like, providing vibration to a seat belt or a steering wheel, or the like.

In the present embodiment, an image of an area around a vehicle, for example, a front area or a rear area is captured by using the imaging system 400. FIG. 12B illustrates an imaging system when capturing an image of a front area of a vehicle (a capturing area 450). The vehicle information acquisition device 420 transmits an instruction to the imaging system 400 or the imaging device 410. Such a configuration can further improve the ranging accuracy.

Although the example of control to avoid a collision to another vehicle has been described above, the embodiment is applicable to automatic driving control for following another vehicle, automatic driving control for not going out of a traffic lane, or the like. Furthermore, the imaging system is not limited to a vehicle such as an automobile and can be applied to a moving unit (moving apparatus) such as a ship, an aircraft, an industrial robot, or the like, for example. In addition, the imaging system can be widely applied to equipment which utilizes object recognition, such as an intelligent transportation system (ITS) without being limited to moving units.

Ninth Embodiment

Figure 13:
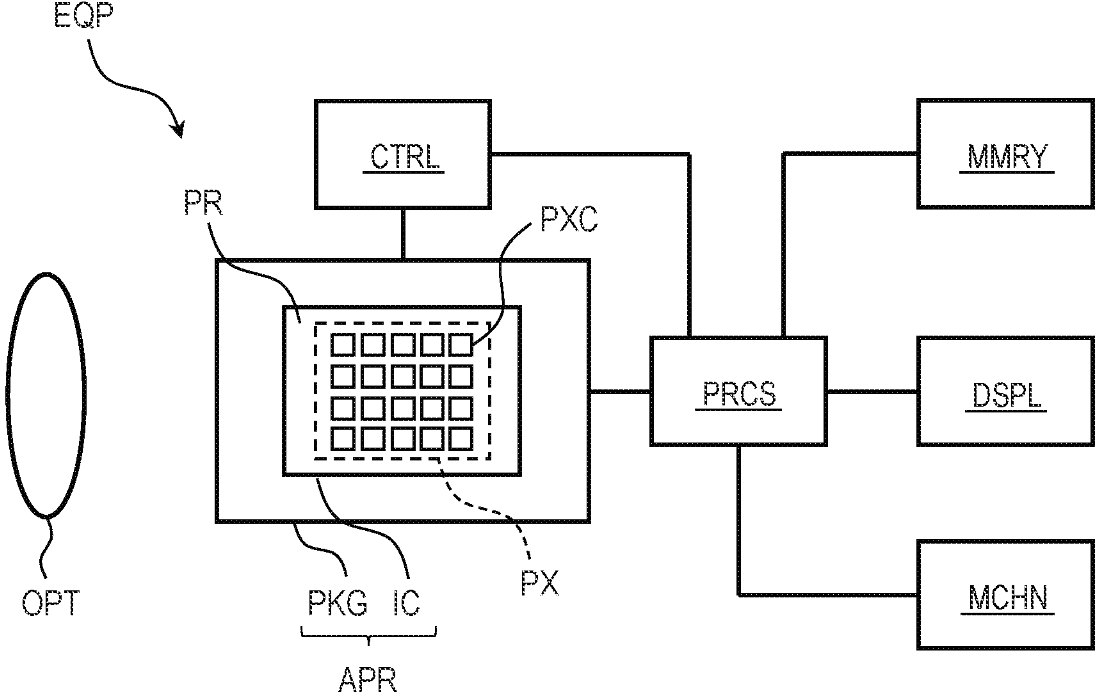
FIG. 13 is a block diagram illustrating a general configuration of equipment according to a ninth embodiment.

Equipment according to the present embodiment will be described. FIG. 13 is a block diagram illustrating the general configuration of the equipment according to the present embodiment.

A photoelectric conversion apparatus APR illustrated as an example in FIG. 13 has the same function as the first embodiment. The whole or a part of the photoelectric conversion apparatus APR is a semiconductor device IC. The photoelectric conversion apparatus APR of the present example can be used as an image sensor, an auto focus (AF) sensor, a light measuring sensor, or a ranging sensor, for example. The semiconductor device IC has a pixel area PX in which one or more pixel circuits PXC including the photoelectric conversion units are arranged in matrix. The semiconductor device IC can have a peripheral area PR around the pixel area PX. A circuit other than the pixel circuit can be arranged in the peripheral area PR.

The photoelectric conversion apparatus APR may have structure (chip lamination structure) in which a first semiconductor chip provided with a plurality of photoelectric conversion units and a second semiconductor chip provided with one or more peripheral circuits are laminated. The peripheral circuits in the second semiconductor chip may be column circuits corresponding to pixel columns of the first semiconductor chip, respectively. Further, the peripheral circuits in the second semiconductor chip may also be matrix circuits corresponding to pixels or pixel blocks of the first semiconductor chip, respectively. For the connection between the first semiconductor chip and the second semiconductor chip, an inter-chip wiring by direct joining of through via (TSV) or conductors made of copper or the like, connection by micro bumps between chips, connection by wire bonding, or the like may be employed.

The photoelectric conversion apparatus APR may include, in addition to the semiconductor device IC, a package PKG that accommodates the semiconductor device IC. The package PKG may include a base member to which the semiconductor device IC is fixed, a cover made of glass or the like facing the semiconductor device IC, and a connection member such as a bonding wire or a bump used for connecting a terminal provided to the base member and a terminal provided to the semiconductor device IC to each other.

The equipment EQP may further have at least any one of an optical apparatus OPT, a control apparatus CTRL, a processing apparatus PRCS, a display apparatus DSPL, a memory apparatus MMRY, and a mechanical apparatus MCHN. The optical apparatus OPT corresponds to the photoelectric conversion apparatus APR as the photoelectric conversion device and may be, for example, a lens, a shutter, or a mirror. The control apparatus CTRL controls the photoelectric conversion apparatus APR and may be, for example, a semiconductor device such as an ASIC. The processing apparatus PRCS processes a signal output from the photoelectric conversion apparatus APR and forms an analog front end (AFE) or a digital front end (DFE). The processing apparatus PRCS is a semiconductor device such as a central processing unit (CPU), an application specific integrated circuit (ASIC), or the like. The display apparatus DSPL is an EL display apparatus or a liquid crystal display apparatus that displays information (image) obtained by the photoelectric conversion apparatus APR. The memory apparatus MMRY is a magnetic device or a semiconductor device that stores information (image) obtained by the photoelectric conversion apparatus APR. The memory apparatus MMRY is a volatile memory such as an SRAM or a DRAM or a nonvolatile memory such as a flash memory or a hard disk drive. The mechanical apparatus MCHN has a movable unit or a thrust unit such as a motor or an engine. In the equipment EQP, a signal output from the photoelectric conversion apparatus APR is displayed on the display apparatus DSPL or externally transmitted by a communication apparatus (not illustrated) of the equipment EQP. It is thus preferable for the equipment EQP to further have the memory apparatus MMRY or the processing apparatus PRCS in addition to the memory circuit unit or the calculation circuit unit of the photoelectric conversion apparatus APR.

The equipment EQP illustrated in FIG. 13 may be an electronic device such as an information terminal having an imaging function (for example, a smartphone, a wearable terminal), a camera (for example, an interchangeable lens camera, a compact camera, a video camera, a surveillance camera), or the like. The mechanical apparatus MCHN in the camera can drive a component of the optical apparatus OPT for zooming, focusing, or shutter operation. Further, the equipment EQP may be transportation equipment (moving unit) such as a vehicle, a ship, an aircraft, or the like. Further, the equipment EQP may be medical equipment such as an endoscope, a CT scanner, or the like.

The mechanical apparatus MCHN in transportation equipment may be used as a moving apparatus. The equipment EQP as the transportation equipment is suitable for those transporting the photoelectric conversion apparatus APR or those assisting and/or automating driving (operation) by using an imaging function. The processing apparatus PRCS for assisting or automating the driving (operation) can perform processing for operating the mechanical apparatus MCHN as a moving apparatus based on information obtained by the photoelectric conversion apparatus APR.

The photoelectric conversion apparatus APR according to the present embodiment can provide a high value to designers, manufacturers, venders, purchasers, and/or users thereof. Thus, mounting the photoelectric conversion apparatus APR on the equipment EQP can also enhance the value of the equipment EQP. It is therefore advantageous to determine mounting the photoelectric conversion apparatus APR of the present embodiment on the equipment EQP for enhancing the value of the equipment EQP in manufacturing or selling the equipment EQP.

Modified Embodiments

The present disclosure is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is also one of the embodiments of the present disclosure.

Note that each of the above embodiments is solely intended to illustrate embodied examples in implementing the present disclosure, and the technical scope of the present disclosure should not be interpreted in a limiting sense by these embodiments. That is, the present disclosure can be implemented in various forms without departing from the technical concept or the primary feature thereof.

According to the present disclosure, stray light entering the photoelectric conversion device via a pad opening can be suppressed.

Embodiments of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described Embodiments and/or that includes one or more circuits (e.g., application specific integrated circuit (ASIC)) for performing the functions of one or more of the above-described Embodiments, and by a method performed by the computer of the system or apparatus by, for example, reading out and executing the computer executable instructions from the storage medium to perform the functions of one or more of the above-described Embodiments and/or controlling the one or more circuits to perform the functions of one or more of the above-described Embodiments. The computer may include one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read-only memory (ROM), a storage of distributed computing systems, an optical disk (such as a compact disc (CD), digital versatile disc (DVD), or Blu-ray Disc™ (BD)), a flash memory device, a memory card, and the like.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-086895, filed May 27, 2022, which is hereby incorporated by reference herein in its entirety.

What is claimed is:

1. A photoelectric conversion device comprising:

a semiconductor substrate having a first face in which a plurality of photoelectric conversion units are formed and a second face opposed to the first face;

an insulating layer provided on the second face and configured to receive entry of light in the insulating layer;

a light-receiving pixel region in which the plurality of photoelectric conversion units are arranged and light transmitting through the insulating layer is received at the plurality of photoelectric conversion units;

a first light-shielded region located adjacent to the light-receiving pixel region and having a light-shielding film, at least a part of the light-shielded film being formed on the insulating layer;

a peripheral region including an opening that penetrates the insulating layer and the semiconductor substrate and exposes a bonding pad provided on the first face side, a second light-shielded region located between the first light-shielded region and the peripheral region and having the light-shielding film formed on the insulating layer, a first trench formed in the semiconductor substrate in the second light-shielded region, a second trench formed in the insulating layer in the second light-shielded region; and an insulating film formed on the light-shielding film, wherein the second trench penetrates the insulating layer, wherein a part of the insulating film is formed in the second trench, wherein a side face and a bottom face of the second trench are covered with the light-shielding film, and wherein, in a planar view to the semiconductor substrate, the first trench and the second trench have portions overlapping each other.

2. The photoelectric conversion device according to claim 1, wherein a member having a different refractive index from the semiconductor substrate is embedded in the first trench.

3. The photoelectric conversion device according to claim 2, wherein when the semiconductor substrate is formed of silicon, the member is any of silicon oxide, silicon nitride, aluminum oxide, hafnium oxide, tantalum oxide, and air.

4. The photoelectric conversion device according to claim 1, wherein the first trench extends from the first face toward the second face, and an end of the first trench does not reach the second face.

5. The photoelectric conversion device according to claim 4, wherein $D/2 \leq T$ is met, where the thickness of the semiconductor substrate is D, and the depth of the first trench is T.

6. The photoelectric conversion device according to claim 1, wherein the first trench extends from the second face toward the first face, and an end of the first trench does not reach the first face.

7. The photoelectric conversion device according to claim 6, wherein $D/2 \leq T$ is met, where the thickness of the semiconductor substrate is D, and the depth of the first trench is T.

8. The photoelectric conversion device according to claim 1, wherein the first trench penetrates the semiconductor substrate.

9. The photoelectric conversion device according to claim 1, wherein the first trench includes a plurality of trenches, and wherein the plurality of trenches do not intersect each other in the planar view.

10. The photoelectric conversion device according to claim 9, wherein the plurality of trenches are aligned in the planar view.

11. The photoelectric conversion device according to claim 1, wherein the first light-shielded region comprises one or both of the plurality of photoelectric conversion units and a circuit unit.

12. The photoelectric conversion device according to claim 1, wherein at least one of an interlayer lens, a color filter, and a micro-lens is formed in the light-receiving pixel region.

13. The photoelectric conversion device according to claim 1, wherein the second trench overlaps the entire first trench in the planar view.

14. The photoelectric conversion device according to claim 1, wherein the first light-shielded region is surrounded by the first trench and the second trench in the planar view.

15. The photoelectric conversion device according to claim 1, wherein the insulating layer is formed of a plurality of laminated films.

16. The photoelectric conversion device according to claim 15, wherein the insulating layer includes a first layer formed of aluminum oxide or hafnium oxide, a second layer formed of tantalum oxide, and a third layer formed of silicon oxide.

17. A method of manufacturing a photoelectric conversion device, wherein the photoelectric conversion device includes a semiconductor substrate having a first face in which a plurality of photoelectric conversion units are formed and a second face opposed to the first face, an insulating layer provided on the second face and configured to receive entry of light in the insulating layer, a light-receiving pixel region in which the plurality of photoelectric conversion units are arranged and light transmitting through the insulating layer is received at the plurality of photoelectric conversion units, a first light-shielded region located adjacent to the light-receiving pixel region and having a light-shielding film formed on the insulating layer, a peripheral region including an opening that penetrates the insulating layer and the semiconductor substrate and exposes a bonding pad provided on the first face side, and a second light-shielded region located between the first light-shielded region and the peripheral region and having the light-shielding film formed on the insulating layer, the method comprising:

forming a first trench in the semiconductor substrate in the second light-shielded region;

forming a second trench in the insulating layer in the second light-shielded region; and forming an insulating film on the light-shielding film, wherein the second trench penetrates the insulating layer, wherein a part of the insulating film is formed in the second trench, wherein a side face and a bottom face of the second trench are covered with the light-shielding film, and wherein, in a planar view to the semiconductor substrate, the first trench and the second trench have portions overlapping each other.

18. The method according to claim 17, further comprising embedding, in the first trench, a member having a different refractive index from the semiconductor substrate.

19. An imaging system comprising:

the photoelectric conversion device according to claim 1; and a signal processing unit configured to process a signal output from the photoelectric conversion device.

20. A moving unit comprising:

the photoelectric conversion device according to claim 1;

a distance information acquisition unit configured to acquire, from a parallax image based on signals from the photoelectric conversion device, distance information on a distance to an object; and a control unit configured to control the moving unit based on the distance information.

21. Equipment comprising:

the photoelectric conversion device according to claim 1; and at least one of the following:

an optical apparatus corresponding to the photoelectric conversion device, a control apparatus configured to control the photoelectric conversion device, a processing apparatus configured to process a signal output from the photoelectric conversion device, a mechanical apparatus controlled based on information obtained by the photoelectric conversion device, a display apparatus configured to display information obtained by the photoelectric conversion device, and a memory apparatus configured to store information obtained by the photoelectric conversion device.

22. The photoelectric conversion device according to claim 1, wherein a distance between a bottom face of the part of the insulating film and the first face is longer than a distance between the second face and the first face.

23. The photoelectric conversion device according to claim 1, wherein a distance between an upper face of the light-shielding film covering a bottom face of the second trench and the first face is longer than a distance between the second face and the first face.

24. The photoelectric conversion device according to claim 23, wherein the bottom face of the second trench is in contact with the second face.

25. A photoelectric conversion device comprising:

a semiconductor substrate having a first face in which a plurality of photoelectric conversion units are formed and a second face opposed to the first face;

an insulating layer provided on the second face and configured to receive entry of light in the insulating layer;

a light-receiving pixel region in which the plurality of photoelectric conversion units are arranged and light transmitting through the insulating layer is received at the plurality of photoelectric conversion units;

a first light-shielded region located adjacent to the light-receiving pixel region and having a light-shielding film formed on the insulating layer;

a peripheral region including an opening that penetrates the insulating layer and the semiconductor substrate and exposes a bonding pad provided on the first face side, a second light-shielded region located between the first light-shielded region and the peripheral region and having the light-shielding film formed on the insulating layer, a first trench formed in the semiconductor substrate in the second light-shielded region; and a second trench formed in the insulating layer in the second light-shielded region, wherein the second trench penetrates the insulating layer, wherein a side face and a bottom face of the second trench are covered with the light-shielding film, wherein, in a planar view to the semiconductor substrate, the first trench and the second trench have portions overlapping each other, and wherein a distance between an upper face of the light-shielding film covering a bottom face of the second trench and the first face is longer than a distance between the second face and the first face.

* * * * *